(12) United States Patent
Chhabra et al.

(10) Patent No.: US 11,495,499 B2
(45) Date of Patent: Nov. 8, 2022

(54) METHOD OF FORMING MULTI-STACK TRANSISTORS IN A SINGLE SEMICONDUCTOR DIE

(71) Applicant: Arm Limited, Cambridge (GB)

(72) Inventors: Amit Chhabra, Noida (IN); David Victor Pietromonaco, Cupertino, CA (US)

(73) Assignee: Arm Limited, Cambridge (GB)

( * ) Notice: Subject to any disclaimer, the term of this patent is extended or adjusted under 35 U.S.C. 154(b) by 47 days.

(21) Appl. No.: 17/125,700

(22) Filed: Dec. 17, 2020

(65) Prior Publication Data
US 2022/0199471 A1  Jun. 23, 2022

(51) Int. Cl.
| | | |
|---|---|---|
| *H01L 21/8228* | (2006.01) | |
| *H01L 21/822* | (2006.01) | |
| *H01L 27/088* | (2006.01) | |
| *H01L 21/8238* | (2006.01) | |
| *H01L 21/8234* | (2006.01) | |
| *H01L 27/092* | (2006.01) | |

(52) U.S. Cl.
CPC .... *H01L 21/8221* (2013.01); *H01L 21/82385* (2013.01); *H01L 21/823456* (2013.01); *H01L 27/088* (2013.01); *H01L 27/092* (2013.01)

(58) Field of Classification Search
CPC ............. H01L 21/8221; H01L 21/8228; H01L 21/823456; H01L 21/82385
USPC ........................................................ 438/199
See application file for complete search history.

(56) References Cited

U.S. PATENT DOCUMENTS

2009/0185407 A1 * 7/2009 Park .................... H01L 27/1052
365/230.06

* cited by examiner

*Primary Examiner* — Hoai V Pham
(74) *Attorney, Agent, or Firm* — Pramudji Law Group PLLC; Ari Pramudji

(57) ABSTRACT

Various implementations described herein relate to a method for manufacturing, or causing to be manufactured, multiple devices packaged within a single semiconductor die. The multiple devices may have first devices that are arranged in a first multi-transistor stack with a first P-N configuration. The multiple devices may have second devices that are arranged in a second multi-transistor stack with a second P-N configuration that is different than the first P-N configuration.

20 Claims, 22 Drawing Sheets

200B
PNNP Multi-Device Stack Split-Gate Architecture 204B

100A

P-over-N Multi-Device Stack Common-Gate Architecture 104A

100B

P-over-N Multi-Device Stack Split-Gate Architecture 104B

100C

N-over-P Multi-Device Stack Common-Gate Architecture 104C

100D

N-over-P Multi-Device Stack Split-Gate Architecture 104BD

100E

N-over-N Multi-Device Stack Common-Gate Architecture 104E

100F

N-over-N Multi-Device Stack Split-Gate Architecture 104F

100G

P-over-P Multi-Device Stack Common-Gate Architecture 104G

100H

P-over-P Multi-Device Stack Split-Gate Architecture 104H

200N

PPNN Multi-Device Stack Split-Gate Architecture 204N

METHOD OF FORMING MULTI-STACK TRANSISTORS IN A SINGLE SEMICONDUCTOR DIE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit architecture, conventional transistor based devices use traditional layout techniques and thus suffer from low density design application that may typically cause unintended consequences in fabrication processes. Therefore, traditional layout techniques can be inefficient, density deficient and typically fail to provide sufficient means for implementing various different layout configurations. Thus, there exists a need to improve traditional layout techniques that allow for efficient device fabrication.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1A:
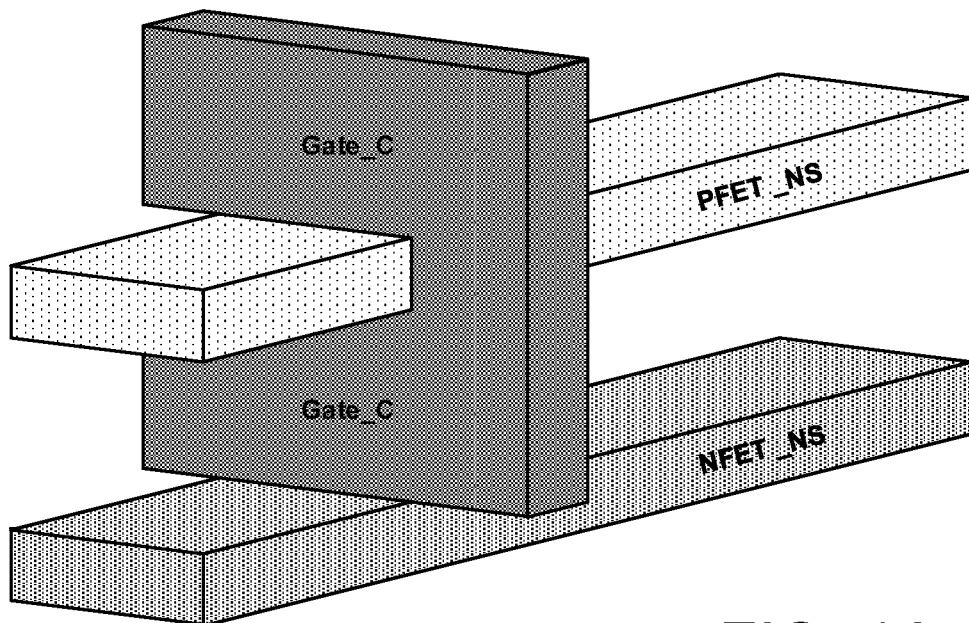
FIGS. 1A-1H illustrate various diagrams of multi-transistor stack architecture in accordance with various implementations described herein.

Various implementations described herein are directed to fabrication schemes and techniques for multi-transistor stack architectures in various physical layout designs for multi-device applications. For instance, various fabrication schemes and techniques described herein provide for various hybrid device stacking techniques for complimentary field effect transistor (FET) technologies, and therefore, aspects of the present disclosure are associated with a novel device stack architecture arrangement for complimentary FET (CFET) technologies and related applications. Also, the various fabrication schemes and techniques described herein provide a method of manufacture using hybrid technologies where multiple device stacks are fabricated together in a single monolithic semiconductor die. For instance, in some applications, N-over-P stacked devices and P-over-N stacked devices may be co-manufactured on a single wafer, and also, N-over-N stacked devices and P-over-P stacked devices refer to variants that may be simultaneously manufactured along with the N-over-P stacked devices and/or P-over-N stacked devices in the same, single monolithic semiconductor die or wafer.

In some implementations, multi-transistor fabrication schemes and techniques described herein use novel technology that supports complimentary FET (CFET) devices, wherein each device is fabricated with nano-sheets (NS) or Fin-FET(FF) that are used to form multiple devices in multi-transistor stacks within a single monolithic semiconductor die with the multiple device stacked on top of each other. The various fabrication schemes and techniques described herein provide for multiple complimentary stack configurations, such as, e.g., an NN based structure having an N-over-N stack configuration and a PP based structure having a P-over-P stack configuration. In various instances, the gates for PFET devices and NFET devices may utilize common-gate and/or split-gate architecture in the multi-device stack configurations. Further, the multi-transistor fabrication schemes and techniques described herein also utilize technology that supports N-over-P devices along with P-over-N devices as additional stack configurations that may be fabricated with the N-over-N and P-over-P stack configurations within a single monolithic semiconductor die in various multi-transistor stack applications.

In some implementations, the various multi-transistor fabrication schemes and techniques described herein may provide for other types of multiple complimentary stack configurations, such as, e.g., an NNNN based structure having an N-over-N-over-N-over-N stack configuration and a PPPP based structure having a P-over-P-over-P-over-P stack configuration. In various instances, the gates for PFET devices and NFET devices may utilize common-gate and/or split-gate architecture in the other types of multi-device stack configurations. Moreover, the multi-transistor fabrication schemes and techniques described herein also utilize technology that supports N-over-P-over-P-over-N devices along with P-over-N-over-N-over-P devices as in the same vertical stack configurations that may be fabricated with the N-over-N-over-N-over-N and P-over-P-over-P-over-P stack configurations within the same single monolithic semiconductor die in various multi-transistor stack applications. Other supported multi-transistor structures may include P-over-P-over-N-over-N, N-over-N-over-P-over-P, P-over-N-over-P-over-N, and N-over-P-over-N-over-P stack configurations.

Various implementations of providing multi-transistor fabrication schemes and techniques will be described herein with reference to FIGS. 1A-1H, 2A-2P and 3-4.

FIGS. 1A-1H illustrate various diagrams of multi-transistor stack architecture in accordance with various implementations described herein. In particular, FIGS. 1A, 1C, 1E and 1G show various diagrams of the multi-transistor stack with a single common-gate architecture, and in addition, FIGS. 1B, 1D, 1F and 1H show various diagrams of the multi-transistor stack with a split-gate architecture.

As shown in FIG. 1A, the P-over-N common-gate multi-transistor architecture 104A may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, in some instances, the common-gate architecture 104A may refer to a single gate (e.g., single poly gate) coupled to the multiple transistors, such as, e.g., the single common-gate (GATE_C) coupled to the PFET_NS device and the NFET_NS device. This arrangement may provide the P-over-N(PN) stack configuration as a two-FET stacked device that is manufactured and/or formed in a single monolithic semiconductor die. Also, in various instances, the complementary P-type and N-type transistors refer to P-type and N-type field-effect transistors (PFET and NFET) that are disposed as a pair of transistors arranged in the P-over-N stack configuration.

Figure 1B:
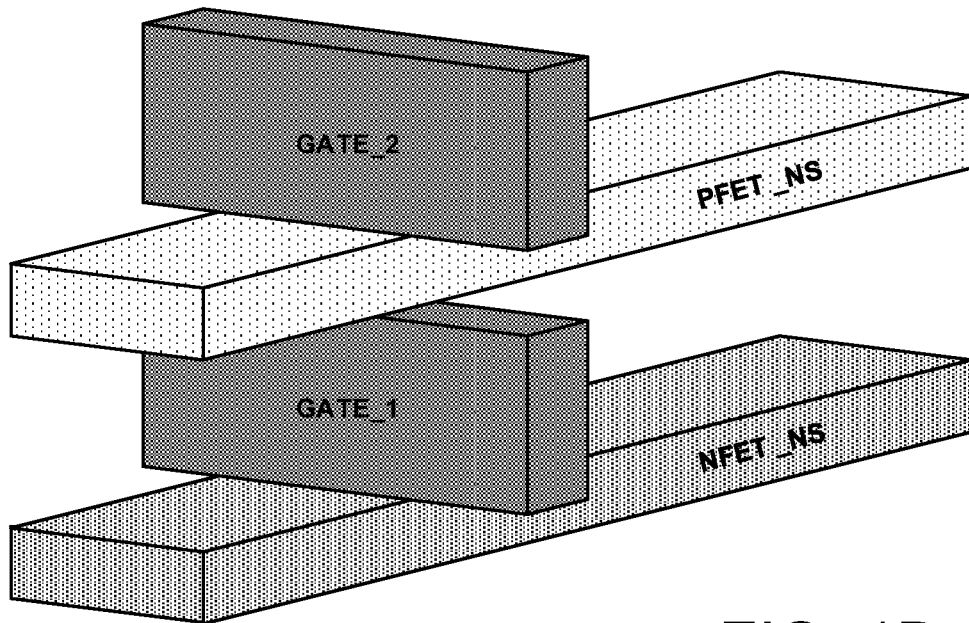

As shown in FIG. 1B, the P-over-N split-gate multi-transistor architecture 104B may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, the split-gate architecture 104B may refer to multiple gates (e.g., dual poly gates) coupled to the multiple transistors, such as, e.g., a first gate (GATE_1) of the split-gate coupled to the NFET_NS device and a second gate (GATE_2) of the split-gate coupled to the PFET_NS device. Also, this arrangement may provide the P-over-N(PN) stack configuration as a two-FET stacked device that is manufactured and/or formed in a single monolithic semiconductor die. Moreover, in some instances, the complementary P-type and N-type transistors refer to PFET/NFET devices that are disposed as a pair of transistors arranged in the P-over-N stack configuration.

Figure 1C:
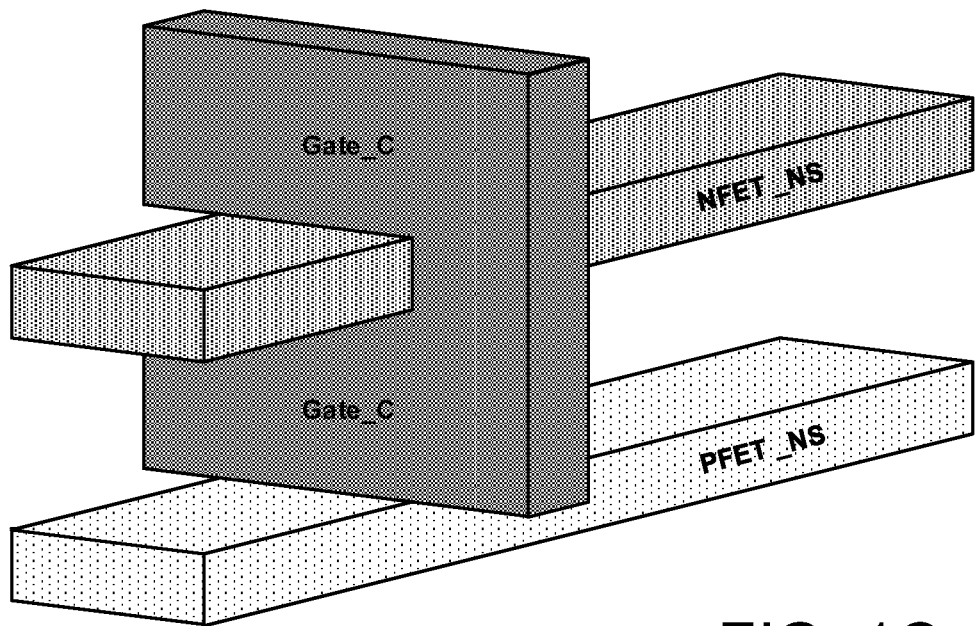

As shown in FIG. 1C, the N-over-P common-gate multi-transistor architecture 104C may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, in some instances, the common-gate architecture 104C may refer to a single gate (e.g., single poly gate) coupled to the multiple transistors, such as, e.g., the single common-gate (GATE_C) coupled to the NFET_NS device and the PFET_NS device. This arrangement provides the N-over-P (NP) stack configuration as a two-FET stacked device that is manufactured and/or formed in a single monolithic semiconductor die. Further, in some instances, the complementary N-type and P-type transistors refer to NFET and PFET devices disposed as a pair of transistors that are arranged in the N-over-P stack configuration.

Figure 1D:
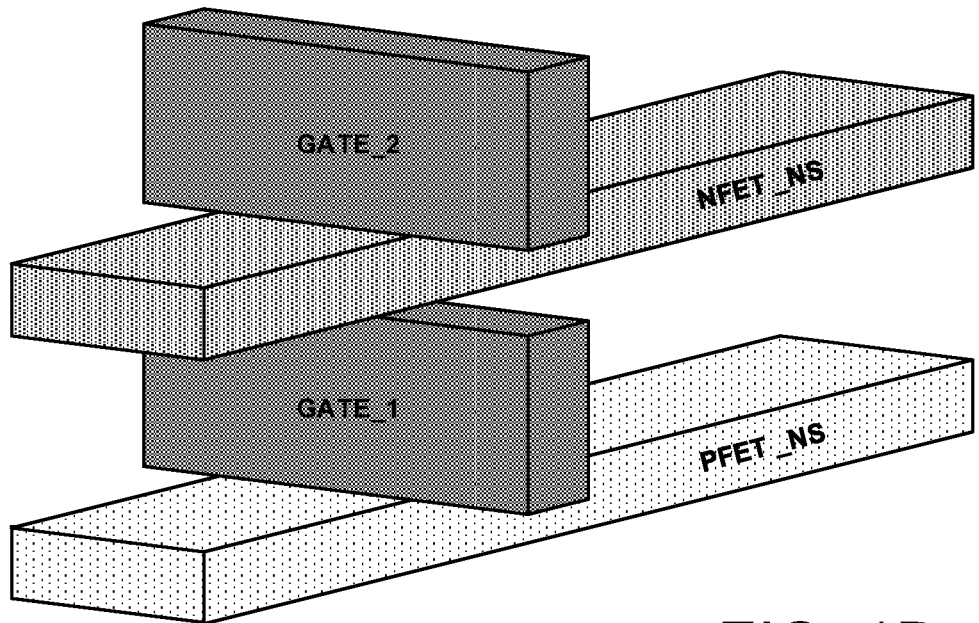

As shown in FIG. 1D, the N-over-P split-gate multi-transistor architecture 104D may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, the split-gate architecture 104D may refer to multiple gates (e.g., dual poly gates) coupled to the multiple transistors, such as, e.g., a first gate (GATE_1) of the split-gate coupled to the PFET_NS device and a second gate (GATE_2) of the split-gate coupled to the NFET_NS device. Also, this arrangement may provide the N-over-P (NP) stack configuration as a two-FET stacked device that is manufactured and/or formed in a single monolithic semiconductor die. Moreover, in some instances, the complementary N-type and P-type transistors refer to NFET/PFET devices that are disposed as a pair of transistors arranged in the N-over-P stack configuration.

Figure 1E:
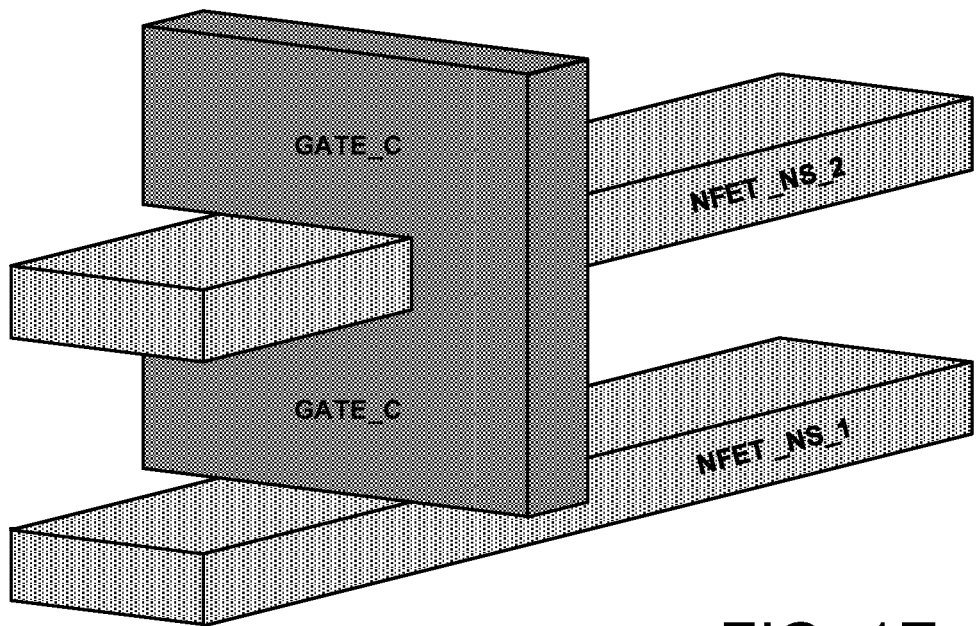

As shown in FIG. 1E, the N-over-N common-gate multi-transistor architecture 104E may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the common-gate architecture 104E refers to a single gate (e.g., single poly gate) coupled to the multiple transistors, such as, e.g., the single common-gate (GATE_C) coupled to the NFET_NS_1 device and the NFET_NS_2 device. This arrangement provides the N-over-N(NN) stack configuration as a two-FET stacked device that is manufactured and/or formed in a single monolithic semiconductor die. Moreover, in some instances, the dual N-over-N transistors refer to an NFET-over-NFET device disposed as a pair of transistors that are arranged in the N-over-N(NN) stack configuration.

Figure 1F:
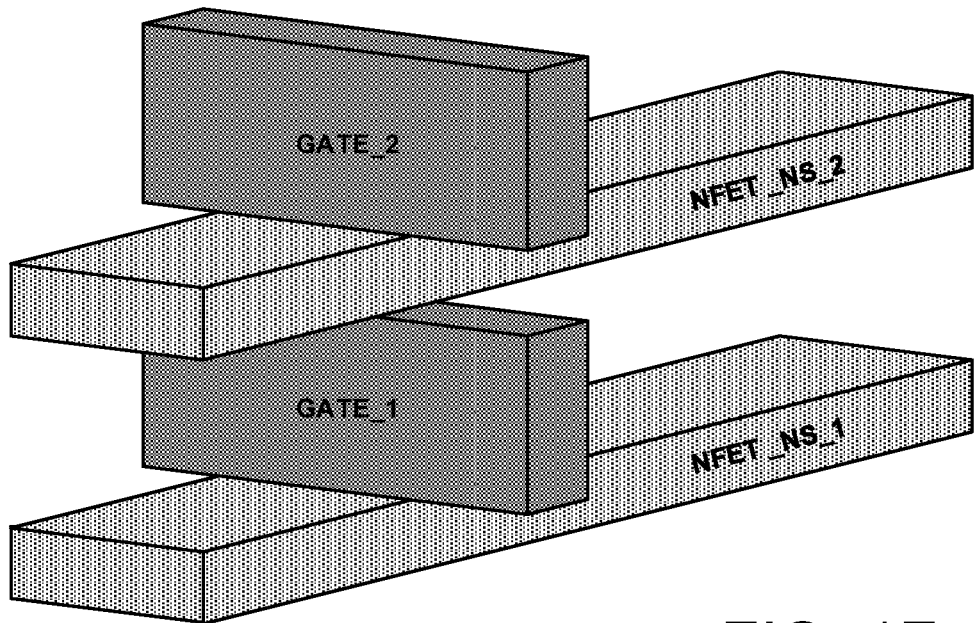

As shown in FIG. 1F, the N-over-N split-gate multi-transistor architecture 104F may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the split-gate architecture 104F may refer to multiple gates (e.g., dual poly gates) coupled to the multiple transistors, such as, e.g., a first gate (GATE_1) of the split-gate coupled to the NFET_NS_1 device and also a second gate (GATE_2) of the split-gate coupled to the NFET_NS_2 device. Also, as shown, this arrangement may provide the N-over-N(NN) stack configuration as a two-FET stacked device that is manufactured and/or formed in a single monolithic semiconductor die. Moreover, in some instances, the dual N-over-N transistors refer to an NFET-over-NFET device disposed as a pair of transistors that are arranged in the N-over-N(NN) stack configuration.

Figure 1G:
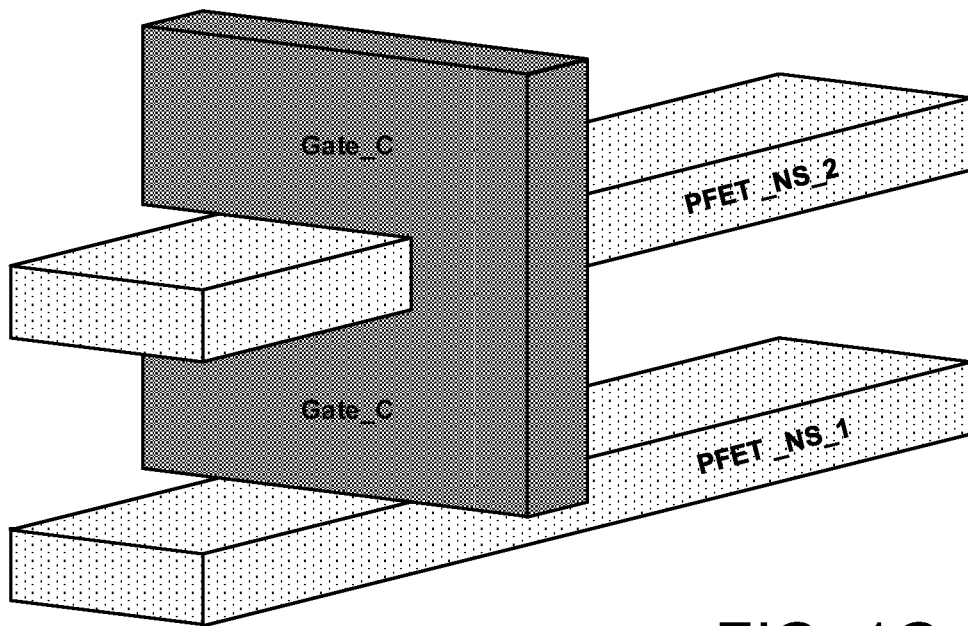

As shown in FIG. 1G, the P-over-P common-gate multi-transistor architecture 104E may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the common-gate architecture 104G refers to a single gate (e.g., single poly gate) coupled to the multiple transistors, such as, e.g., the single common-gate (GATE_C) coupled to the PFET_NS_1 device and the PFET_NS_2 device. This arrangement provides the P-over-P (PP) stack configuration as a two-FET stacked device that is manufactured and/or formed in a single monolithic semiconductor die. Moreover, in some instances, the dual P-over-P transistors refer to a PFET-over-PFET device disposed as a pair of transistors that are arranged in the P-over-P (PP) stack configuration.

Figure 1H:
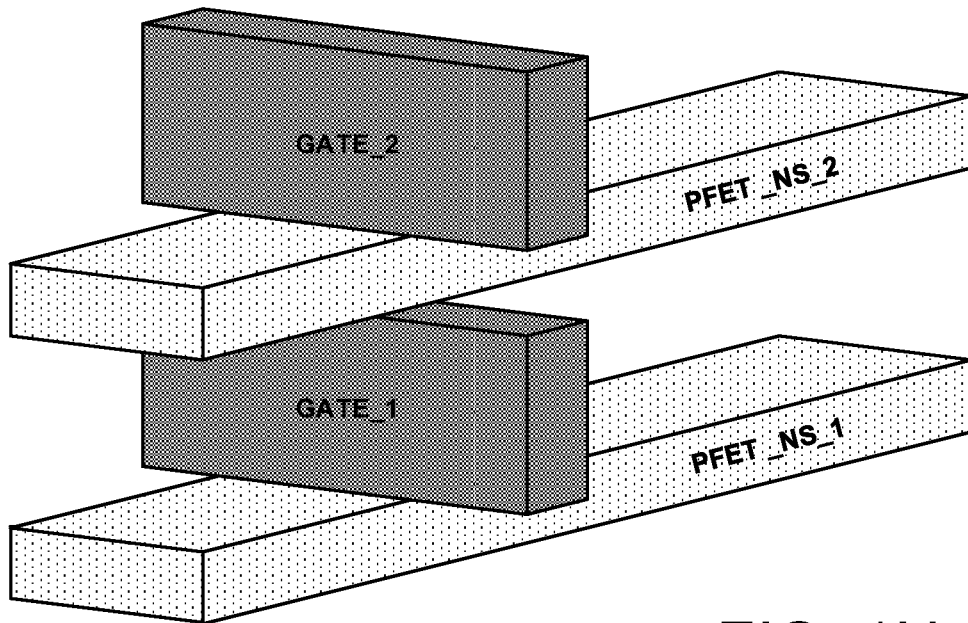

As shown in FIG. 1H, the P-over-P split-gate multi-transistor architecture 104H may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the split-gate architecture 104H may refer to multiple gates (e.g., dual poly gates) coupled to the multiple transistors, such as, e.g., a first gate (GATE_1) of the split-gate coupled to the PFET_NS_1 device and also a second gate (GATE_2) of the split-gate coupled to the PFET_NS_2 device. Also, as shown, this arrangement may provide the P-over-P (PP) stack configuration as a two-FET stacked device that is manufactured and/or formed in a single monolithic semiconductor die. Moreover, in some instances, the dual P-over-P transistors refer to a PFET-over-PFET device disposed as a pair of transistors that are arranged in the P-over-P (PP) stack configuration.

In some implementations, in reference to FIGS. 1A-1H, the gate architectures may utilize a common-gate architecture and/or a split-gate architecture. For instance, as shown in FIGS. 1A, 1C, 1E and 1G, the multiple transistors (PFET and NFET) may share a single gate structure. Thus, the pair of stacked PFET/NFET devices may share a single common-gate structure. In other instances, as shown in FIGS. 1B, 1D, 1F and 1H, the multiple transistors (PFET and NFET) may utilize a split-gate structure. Thus, the pair of stacked PFET/NFET devices may share a dual split-gate structure.

FIGS. 2A-2H illustrate various diagrams of multi-transistor stack architecture in accordance with various implementations described herein. In particular, FIGS. 2A, 2C, 2E and 2G show various diagrams of the multi-transistor stack with dual-common-gate architecture, and in addition, FIGS. 2B, 2D, 2F and 2H show various diagrams of the multi-transistor stack with a split-gate architecture.

Figure 2A:
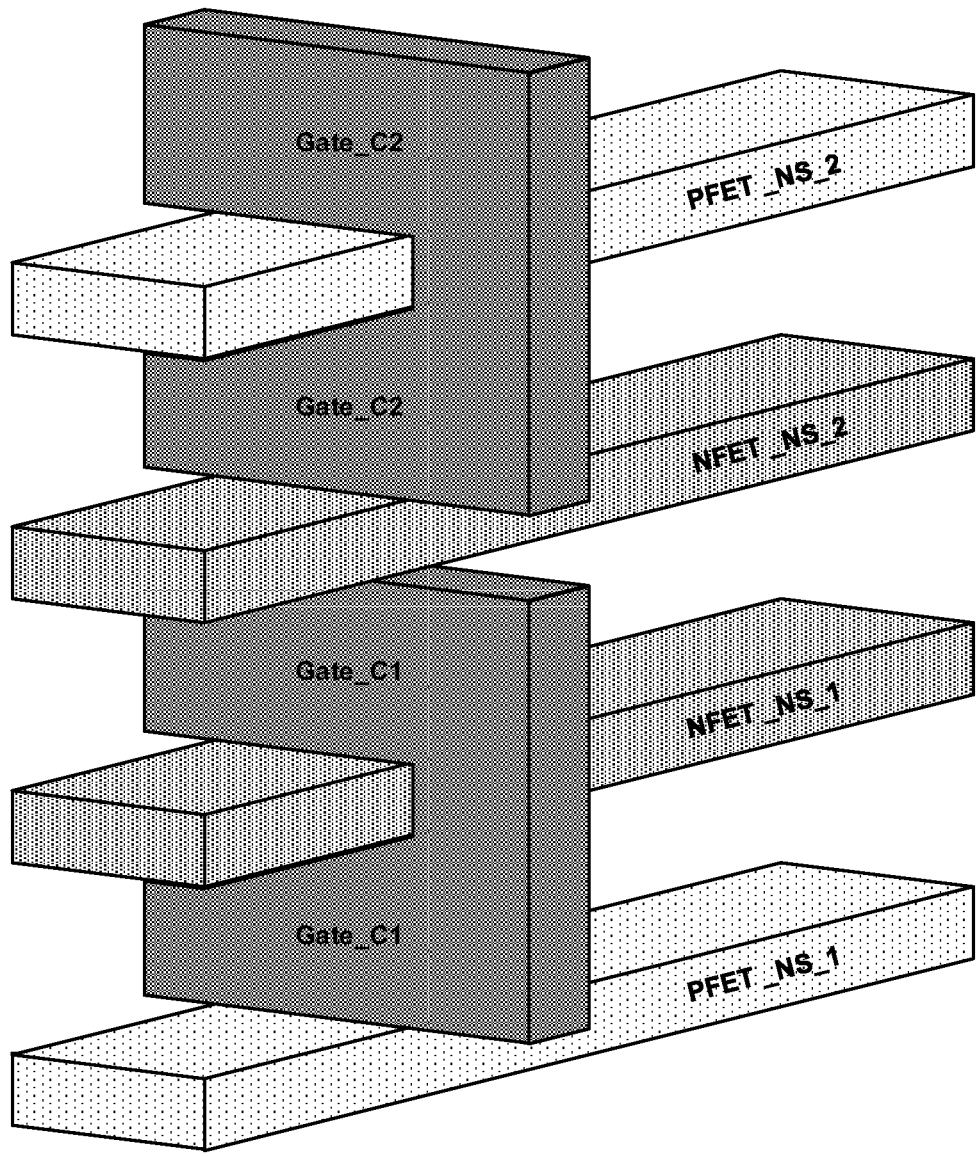
FIGS. 2A-2P illustrate various diagrams of multi-transistor stack architecture in accordance with various implementations described herein.

As shown in FIG. 2A, the P-over-N-over-N-over-P (PNNP) dual-common-gate related transistor architecture 204A may include multiple transistors (e.g., 2 PFET devices and 2 NFET devices) that are arranged in a multi-transistor stack configuration. In some instances, a first PFET may be formed in a first PFET nano-sheet (PFET_NS_1), and a second PFET may be formed in a second PFET nano-sheet (NFET_NS_2), which may be disposed vertically in a single stack. Also, a first NFET may be formed in a first NFET nano-sheet (NFET_NS_1), and a second NFET may be formed in a second NFET nano-sheet (NFET_NS_2), which may be disposed vertically in the same single stack with the PFET devices. The common-gate architecture 204A may include multiple common-gates (e.g., dual poly gate lines) coupled to the multiple transistors. In some instances, a first common-gate (GATE_C1) may be coupled to the PFET_NS_1 device and NFETNS_1 device, and also, a second common-gate (GATE_C2) may be coupled to the NFET_NS_2 device and PFET_NS_2 device. This multi-device stack arrangement provides the PNNP stack configuration as a four-FET stacked device that is manufactured and/or formed in a same single monolithic semiconductor die. Further, in some instances, the pair of N-type devices may be disposed between the pair of P-type devices in the multi-transistor stack architecture 204A along with the dual-common-gate structure.

Figure 2B:
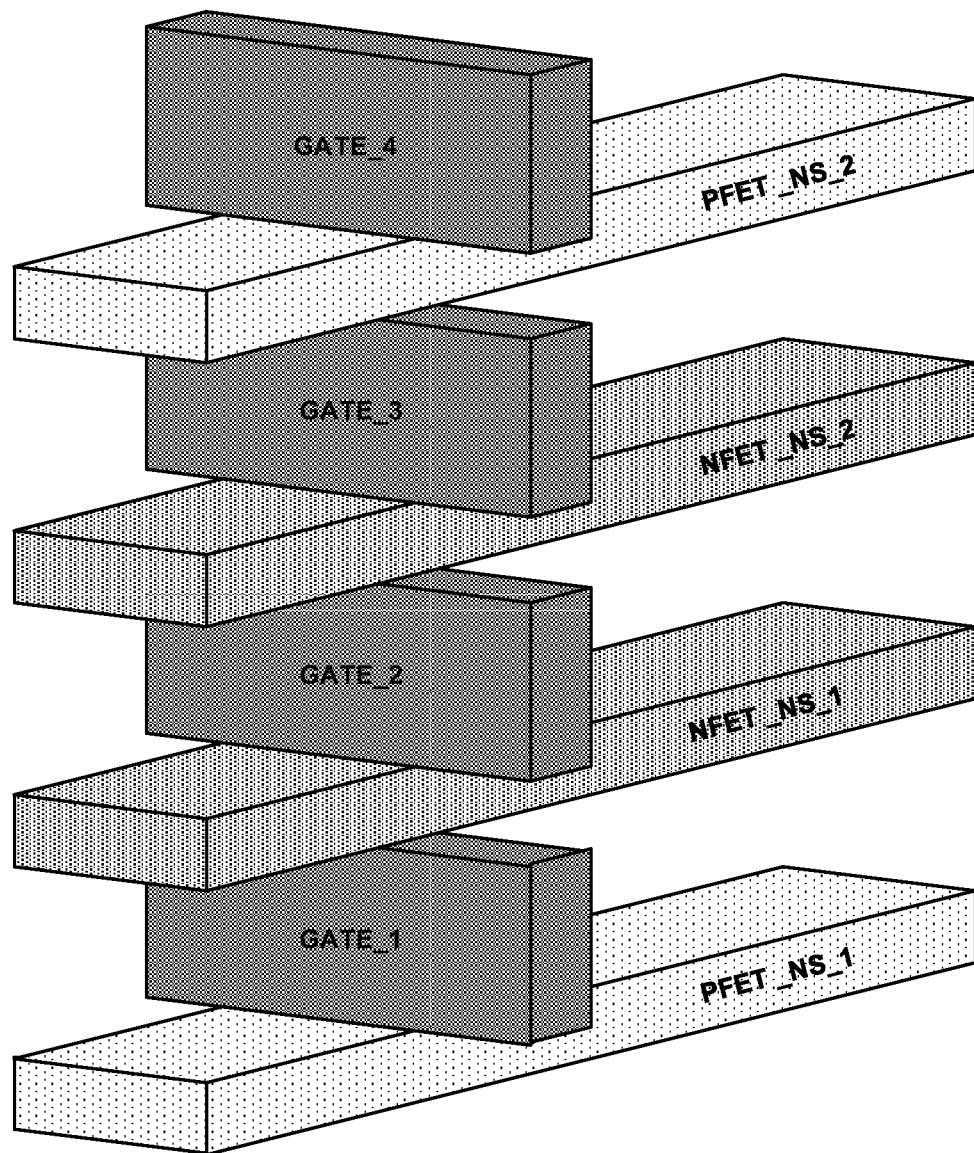

As shown in FIG. 2B, the P-over-N-over-N-over-P (PNNP) split-gate related transistor architecture 204B may include multiple transistors (e.g., 2 PFET devices and 2 NFET devices) arranged in a multi-transistor stack configuration. In various instances, a first PFET may be formed in a first PFET nano-sheet (PFET_NS_1), and a second PFET may be formed in a second PFET nano-sheet (PFET_NS_2), which may be disposed vertically in a single stack. In addition, a first NFET may be formed in a first NFET nano-sheet (NFET_NS_1), and a second NFET may be formed in a second NFET nano-sheet (NFET_NS_2), which may be disposed vertically in the same single stack along with the two PFET devices. The split-gate architecture 204B may include multiple split-gates (e.g., multiple poly gate lines) coupled to the multiple transistors. In some instances, a first gate (GATE_1) may be coupled to the PFET_NS_1 device, a second gate (GATE_2) may be coupled to the NFET_NS_1 device, a third gate (GATE_3) may be coupled to the NFET_NS_2 device, and a fourth gate (GATE_4) may be coupled to the PFET_NS_2 device. This multi-device stack arrangement provides the PNNP stack configuration as a four-FET stacked device that is manufactured and/or formed in a same single monolithic semiconductor die. Also, in some instances, the pair of N-type devices may be disposed between the pair of P-type devices in the multi-transistor stack architecture 204B along with the quad-split-gate structure.

Figure 2C:
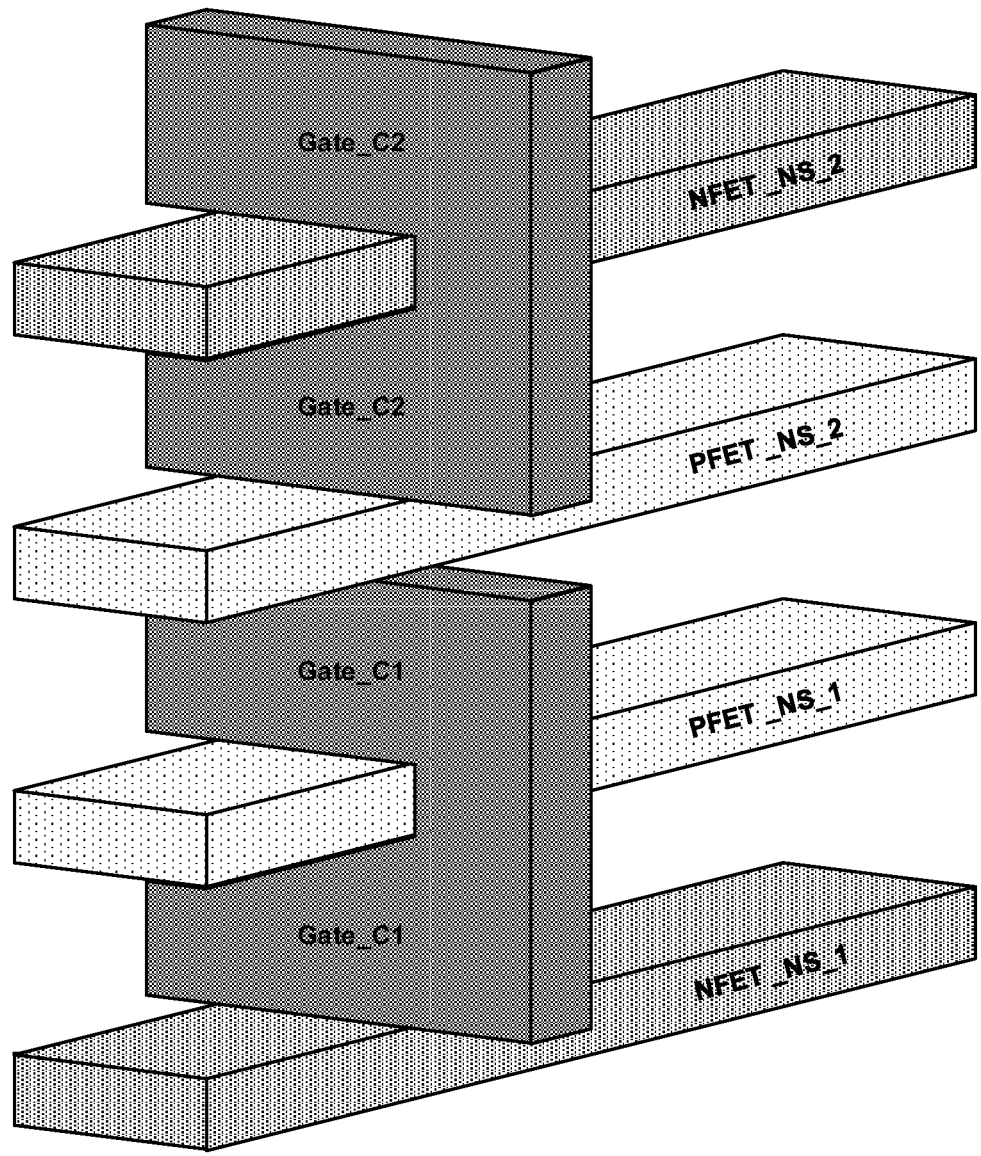

As shown in FIG. 2C, the N-over-P-over-P-over-N (NPPN) dual-common-gate related transistor architecture 204C may include multiple transistors (e.g., 2 NFET devices and 2 PFET devices) that are arranged in a multi-transistor stack configuration. In some instances, a first NFET may be formed in a first NFET nano-sheet (NFET_NS_1), and a second NFET may be formed in a second NFET nano-sheet (NFET_NS_2), which may be disposed vertically in a single stack. Also, a first PFET may be formed in a first PFET nano-sheet (PFET_NS_1), and a second PFET may be formed in a second PFET nano-sheet (PFET_NS_2), which may be disposed vertically in the same single stack with the NFET devices. The common-gate architecture 204C may have multiple common-gates (e.g., dual poly gate lines) coupled to the multiple transistors. In some instances, a first common-gate (GATE_C1) may be coupled to the NFET_NS_1 device and PFET_NS_1 device, and also, a second common-gate (GATE_C2) may be coupled to the PFET_NS_2 device and NFET_NS_2 device. This multi-device stack arrangement provides the NPPN stack configuration as a four-FET stacked device that is manufactured and/or formed in a same single monolithic semiconductor die. Further, in some instances, the pair of P-type devices may be disposed between the pair of N-type devices in the multi-transistor stack architecture 204C along with the dual-common-gate structure.

Figure 2D:
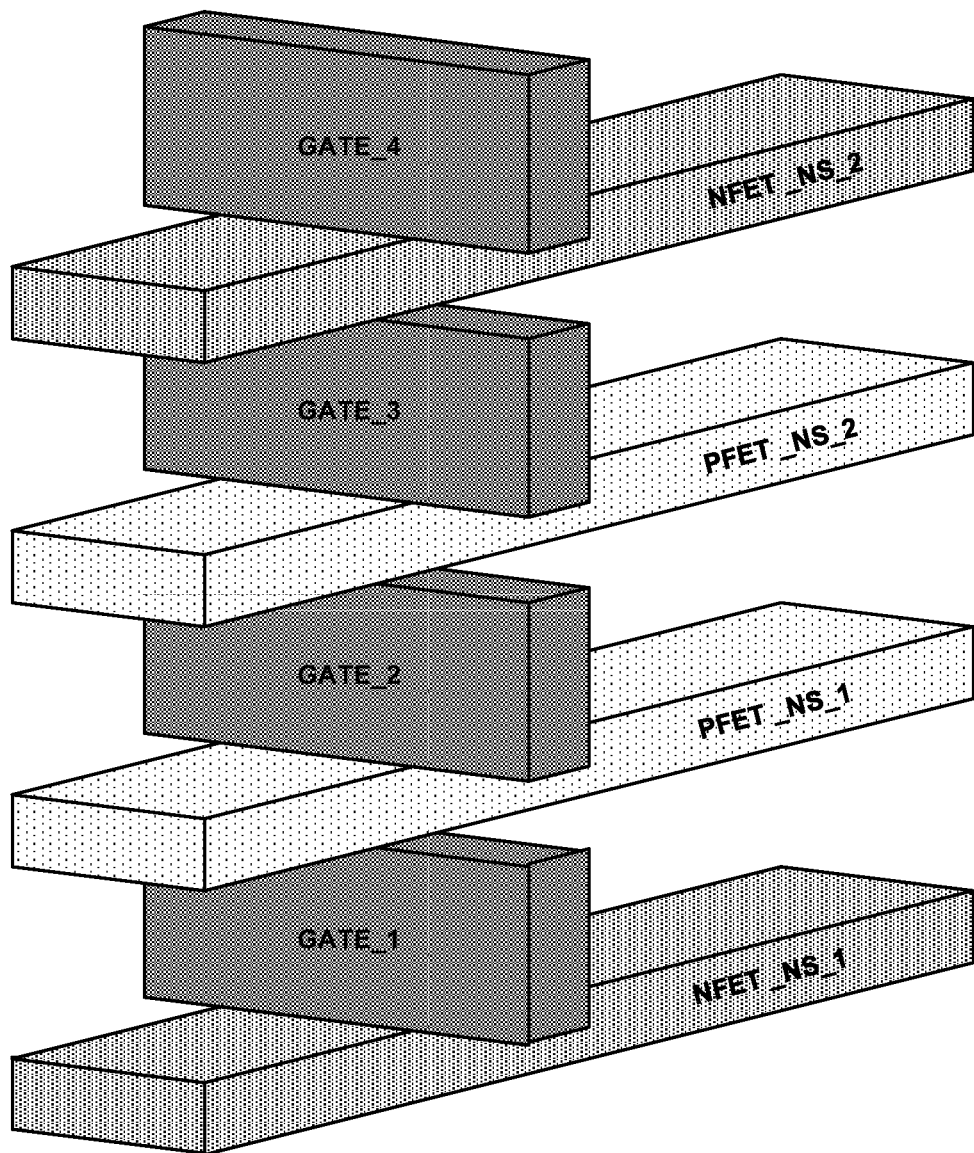

As shown in FIG. 2D, the N-over-P-over-P-over-N (NPPN) split-gate related transistor architecture 204D may include multiple transistors (e.g., 2 NFET devices and 2 PFET devices) arranged in a multi-transistor stack configuration. In various instances, a first NFET may be formed in a first NFET nano-sheet (NFET_NS_1), and a second NFET may be formed in a second NFET nano-sheet (NFET_NS_2), which may be disposed vertically in a single stack. In addition, a first PFET may be formed in a first PFET nano-sheet (PFET_NS_1), and a second PFET may be formed in a second PFET nano-sheet (PFET_NS_2), which may be disposed vertically in the same single stack along with the two NFET devices. The split-gate architecture 204D may include multiple split-gates (e.g., multiple poly gate lines) coupled to the multiple transistors. In some instances, a first gate (GATE_1) may be coupled to the NFET_NS_1 device, a second gate (GATE_2) may be coupled to the PFET_NS_1 device, a third gate (GATE_3) may be coupled to the PFET_NS_2 device, and a fourth gate (GATE_4) may be coupled to the NFET_NS_2 device. This multi-device stack arrangement provides the NPPN stack configuration as a four-FET stacked device that is manufactured and/or formed in a same single monolithic semiconductor die. Also, in some instances, the pair of P-type devices may be disposed between the pair of N-type devices in the multi-transistor stack architecture 204D along with the quad-split-gate structure.

Figure 2E:
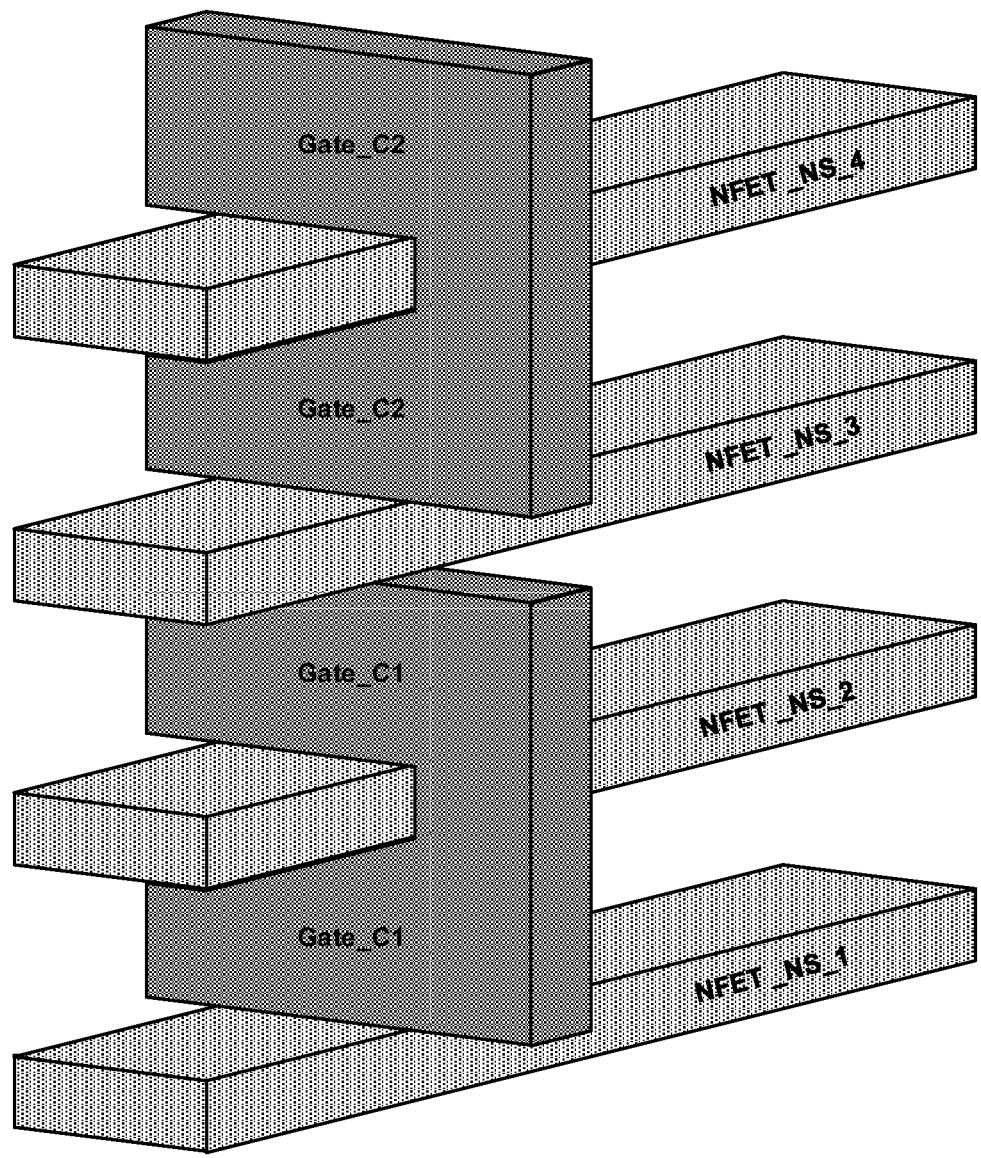

As shown in FIG. 2E, the N-over-N-over-N-over-N (NNNN) dual-common-gate related transistor architecture 204E may include multiple transistors (e.g., 4 NFET devices) that are arranged in a multi-transistor stack configuration. In some instances, a first NFET may be formed in a first NFET nano-sheet (NFET_NS_1), and a second NFET may be formed in a second NFET nano-sheet (NFET_NS_2), which may be disposed vertically in a single stack. Also, in some instances, a third NFET may be formed in a third NFET nano-sheet (NFET_NS_3), and a fourth NFET may be formed in a fourth NFET nano-sheet (NFET_NS_4), which may be disposed vertically in the same single stack with the other NFET devices. The common-gate architecture 204E includes multiple common-gates (e.g., dual poly gate lines) coupled to the multiple transistors. In some instances, a first common-gate (GATE_C1) may be coupled to NFET_NS_1 device and NFET_NS_2 device, and also, a second common-gate (GATE_C2) may be coupled to the NFET_NS_3 device and NFET_NS_4 device. This multi-device stack arrangement provides the NNNN stack configuration as a four-FET stacked device that is manufactured and/or formed in a same single monolithic semiconductor die. Further, in some instances, the quad-stack of N-type devices may be vertically disposed in the multi-transistor stack architecture 204E along with the dual-common-gate structure.

Figure 2F:
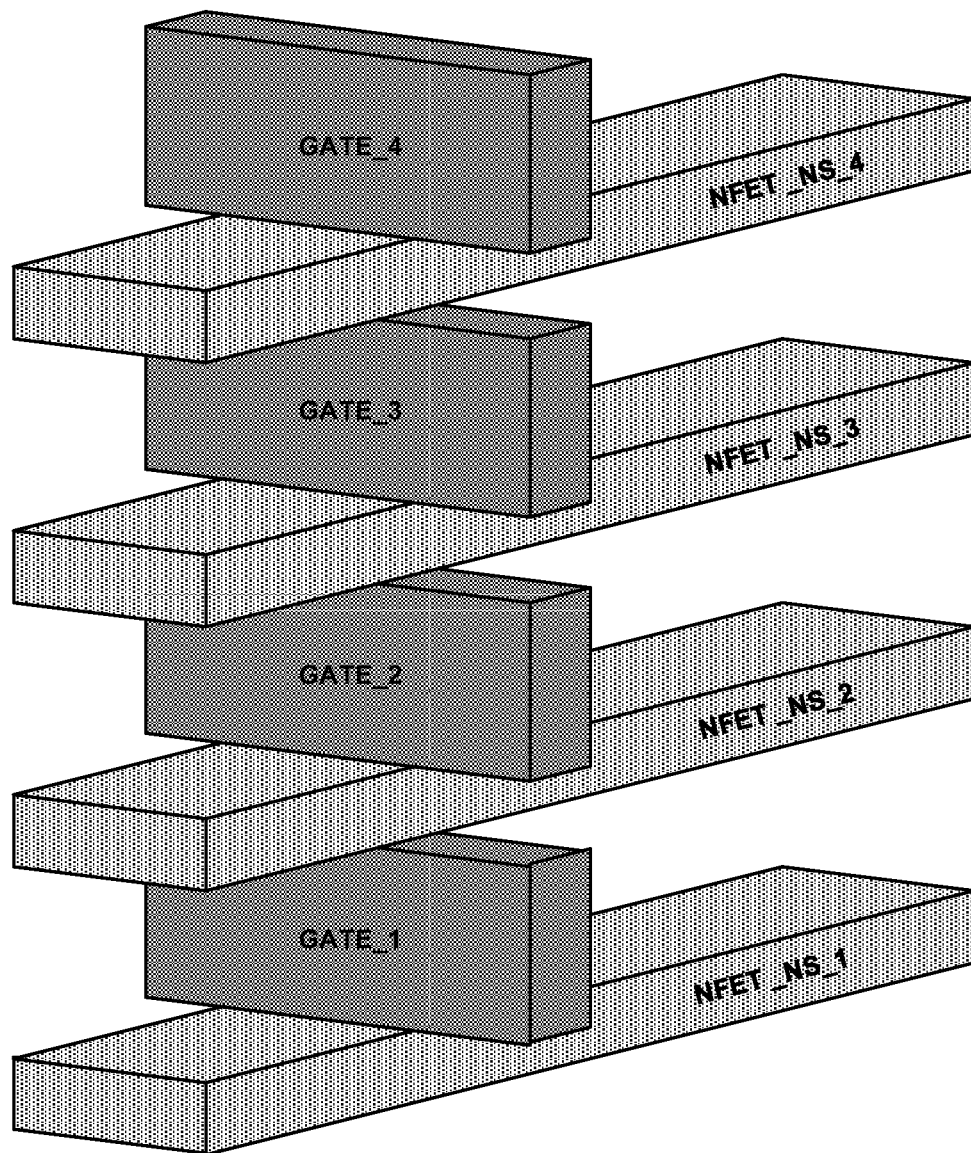

As shown in FIG. 2F, the N-over-N-over-N-over-N (NNNN) quad-split-gate related transistor architecture 204F may have multiple transistors (e.g., 4 NFET devices) arranged in a multi-transistor stack configuration. In various instances, a first NFET may be formed in a first NFET nano-sheet (NFET_NS_1), and a second NFET may be formed in a second NFET nano-sheet (NFET_NS_2), which may be disposed vertically in a single stack. Also, a third NFET may be formed in a third NFET nano-sheet (NFET_NS_3), and a fourth NFET may be formed in a fourth NFET nano-sheet (NFET_NS_4), which may be disposed vertically in the same single stack with the other NFET devices. The split-gate architecture 204F may include multiple split-gates (e.g., multiple poly gate lines) coupled to the multiple transistors. In various instances, a first gate (GATE_1) may be coupled to the NFET_NS_1 device, a second gate (GATE_2) may be coupled to the NFET_NS_2 device, a third gate (GATE_3) may be coupled to the NFET_NS_3 device, and a fourth gate (GATE_4) may be coupled to the NFET_NS_4 device. Also, this multi-device stack arrangement provides the NNNN stack configuration as a four-FET stacked device that is manufactured and/or formed in a same single monolithic semiconductor die. Further, in some instances, the quad-stack of N-type devices may be vertically disposed in the multi-transistor stack architecture 204F along with the quad-split-gate structure.

Figure 2G:
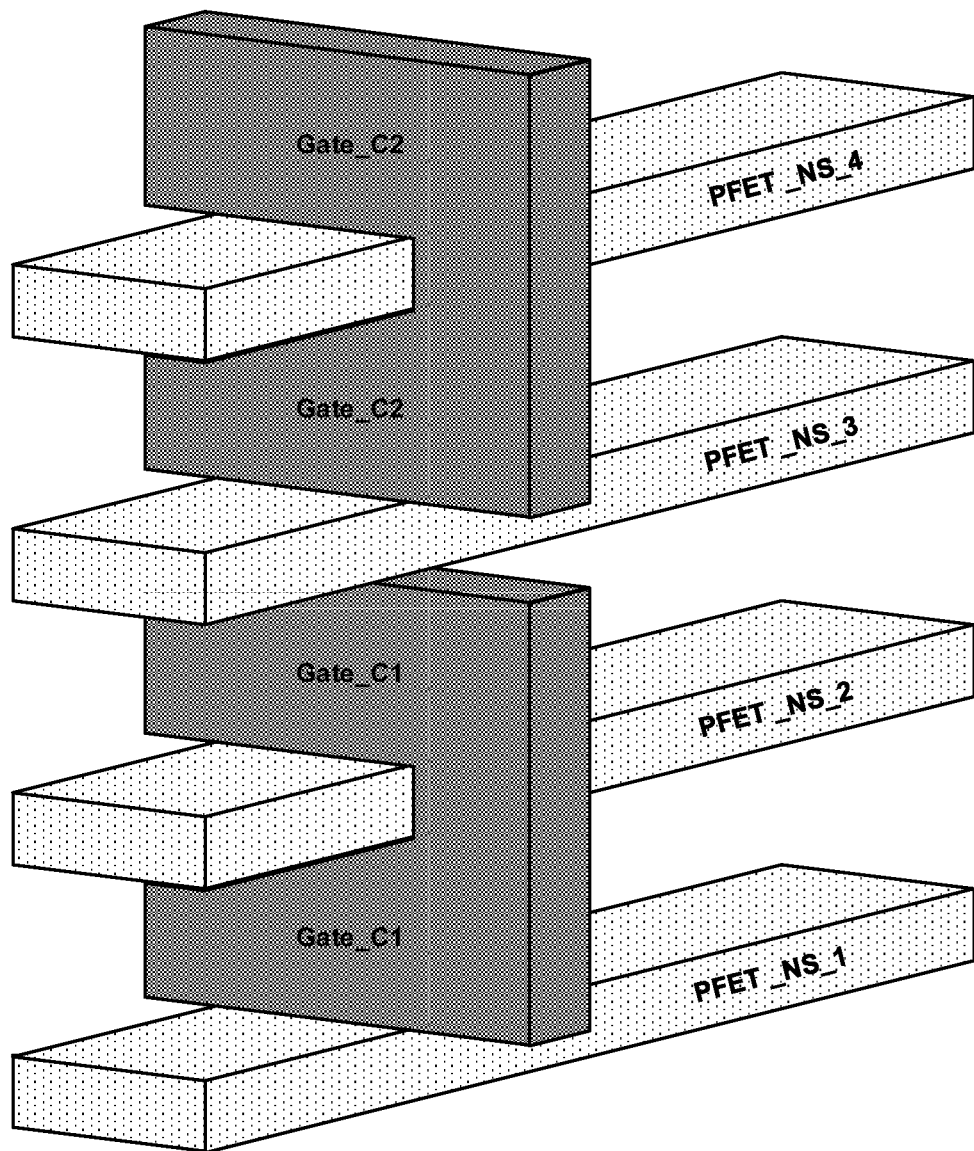

As shown in FIG. 2G, the P-over-P-over-P-over-P (PPPP) dual-common-gate related transistor architecture 204G may have multiple transistors (e.g., 4 PFET devices) that are arranged in a multi-transistor stack configuration. In some instances, a first PFET may be formed in a first PFET nano-sheet (PFET_NS_1), and a second PFET may be formed in a second PFET nano-sheet (PFET_NS_2), which may be disposed vertically in a single stack. Also, in various instances, a third PFET may be formed in a third PFET nano-sheet (PFET_NS_3), and a fourth PFET may be formed in a fourth PFET nano-sheet (PFET_NS_4), which may be disposed vertically in the same single stack with the other PFET devices. The common-gate architecture 204G has multiple common-gates (e.g., dual poly gate lines) coupled to the multiple transistors. In various instances, a first common-gate (GATE_C1) may be coupled to PFET_NS_1 device and the PFET_NS_2 device, and also, a second common-gate (GATE_C2) may be coupled to the PFET_NS_3 device and the PFET_NS_4 device. This multi-device stack arrangement may provide the PPPP stack configuration as a four-FET stacked device that is manufactured and/or formed in a same single monolithic semiconductor die. Moreover, in some instances, the quad-stack of P-type devices may be vertically disposed together in the multi-transistor stack architecture 204G along with the dual-common-gate structure.

Figure 2H:
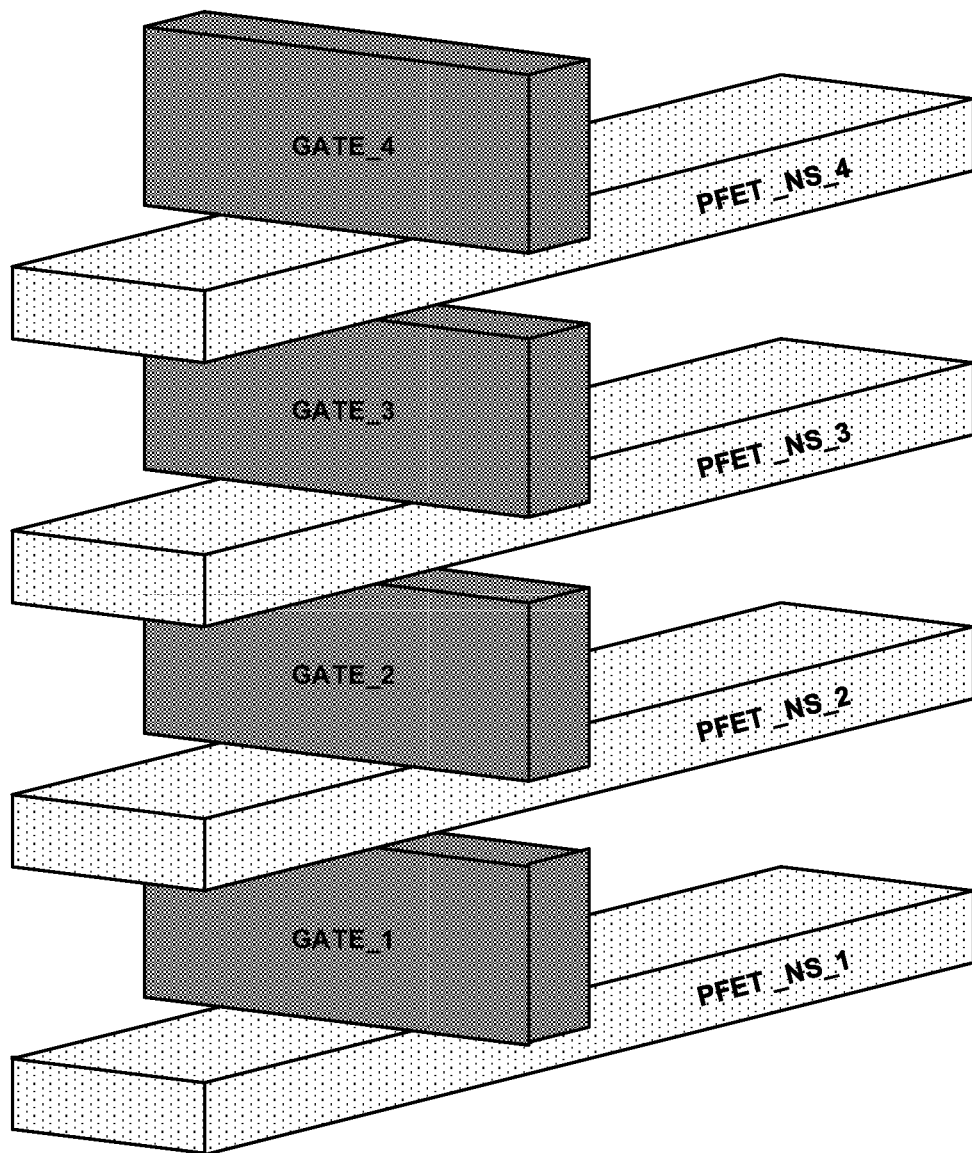

As shown in FIG. 2H, the P-over-P-over-P-over-P (PPPP) quad-split-gate related transistor architecture 204H may have multiple transistors (e.g., 4 PFET devices) arranged in a multi-transistor stack configuration. In various instances, a first PFET may be formed in a first PFET nano-sheet (PFET_NS_1), and a second PFET may be formed in a second PFET nano-sheet (PFET_NS_2), which may be disposed vertically in a single stack. Also, a third PFET may be formed in a third PFET nano-sheet (PFET_NS_3), and a fourth PFET may be formed in a fourth PFET nano-sheet (PFET_NS_4), which may be disposed vertically in the same single stack with the other NFET devices. The split-gate architecture 204H may include multiple split-gates (e.g., multiple poly gate lines) coupled to the multiple transistors. In various instances, a first gate (GATE_1) may be coupled to the PFET_NS_1 device, a second gate (GATE_2) may be coupled to the PFET_NS_2 device, a third gate (GATE_3) may be coupled to the PFET_NS_3 device, and a fourth gate (GATE_4) may be coupled to the PFET_NS_4 device. Also, this multi-device stack arrangement provides the PPPP stack configuration as a four-FET stacked device that is manufactured and/or formed in a same single monolithic semiconductor die. Further, in some instances, the quad-stack of P-type devices may be vertically disposed in the multi-transistor stack architecture 204H along with the quad-split-gate structure.

In some implementations, based on the foregoing description provided herein above in reference to FIGS. 2A-2H, the various multi-transistor fabrication schemes and techniques described herein may be utilized to implement various other multi-transistor stack configurations as shown in FIGS. 2I-2P.

Figure 2I:
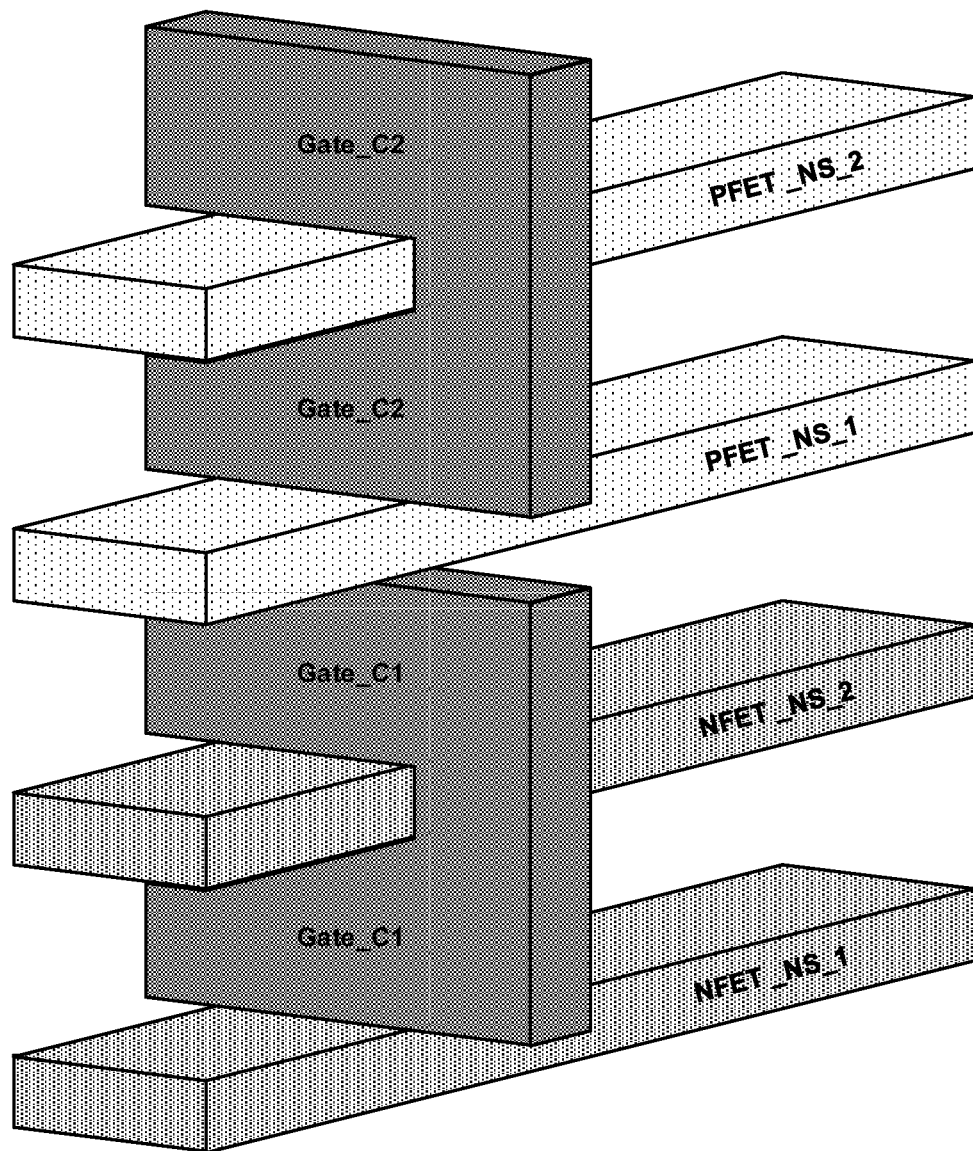
Figure 2J:
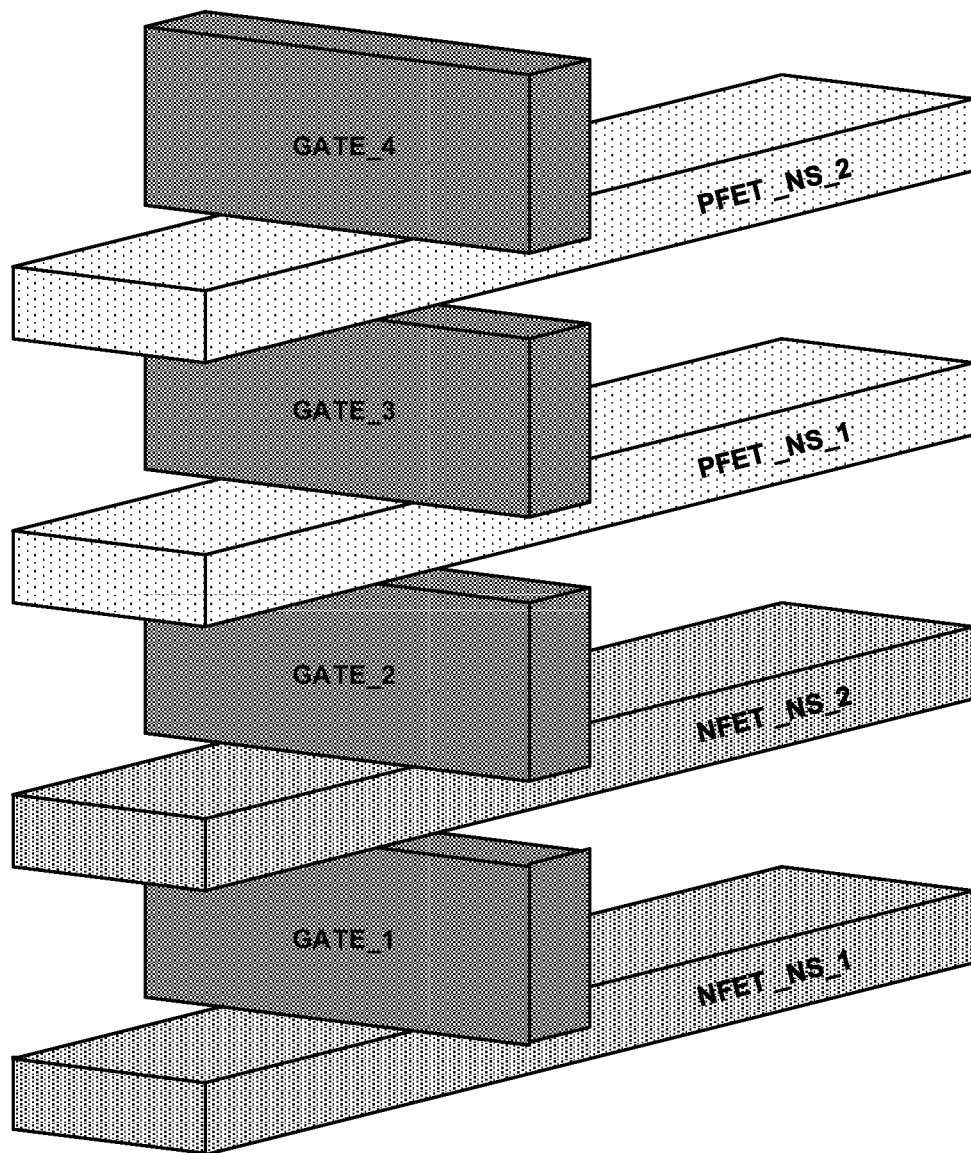

For instance, as shown in FIG. 2I, an NNPP common-gate related transistor architecture 204I may provide for multiple transistors (e.g., 2 NFET devices and 2 PFET devices) arranged in a multi-transistor stack configuration. In some instances, the NNPP transistor architecture 204I may refer to a P-over-P-over-N-over-N stack structure. Also, as shown in FIG. 2J, an NNPP split-gate related transistor architecture 204J may have multiple transistors (e.g., 2 NFET devices and 2 PFET devices) arranged in another multi-transistor stack configuration. In some instances, the NNPP transistor architecture 204J may refer to a P-over-P-over-N-over-N stack structure.

Figure 2K:
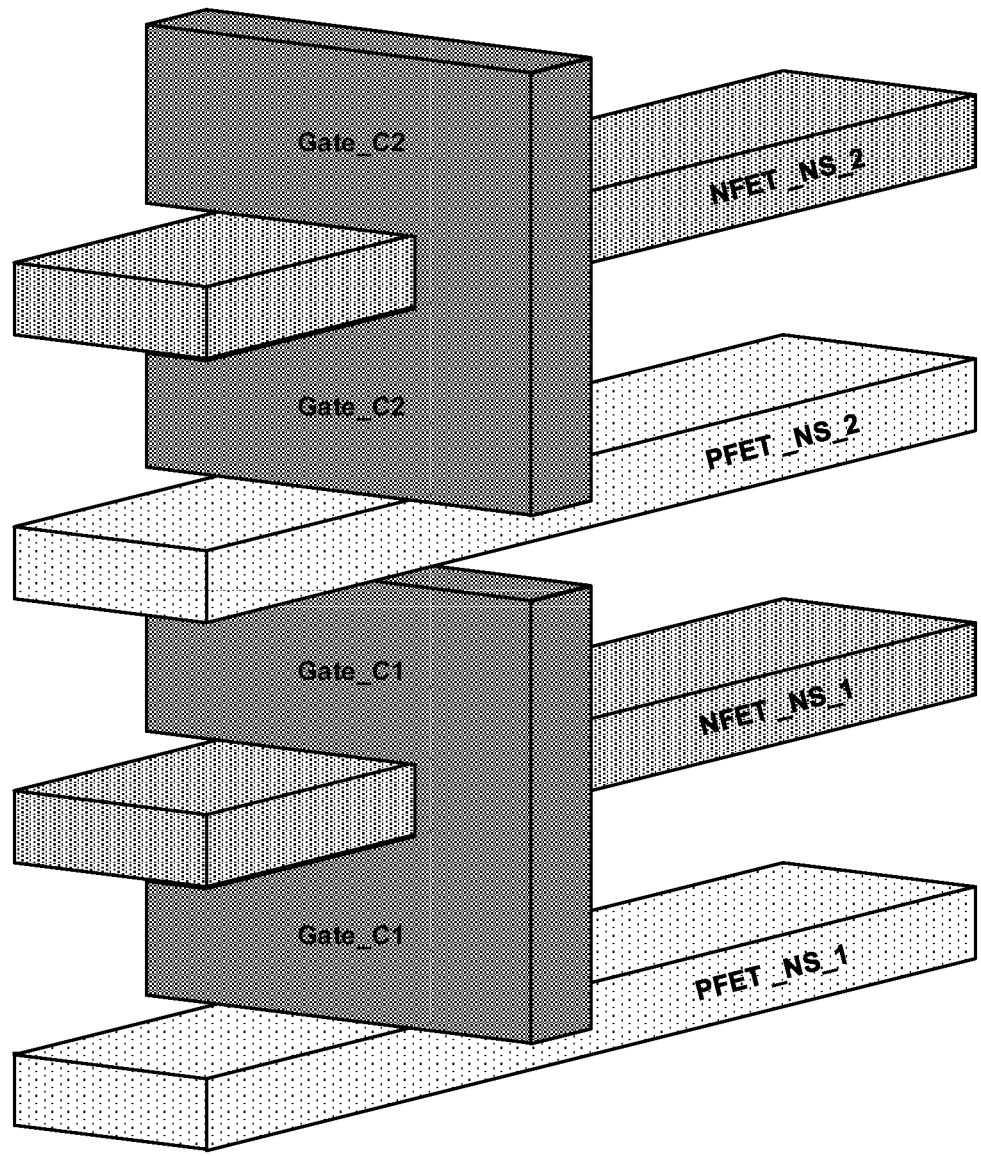
Figure 2L:
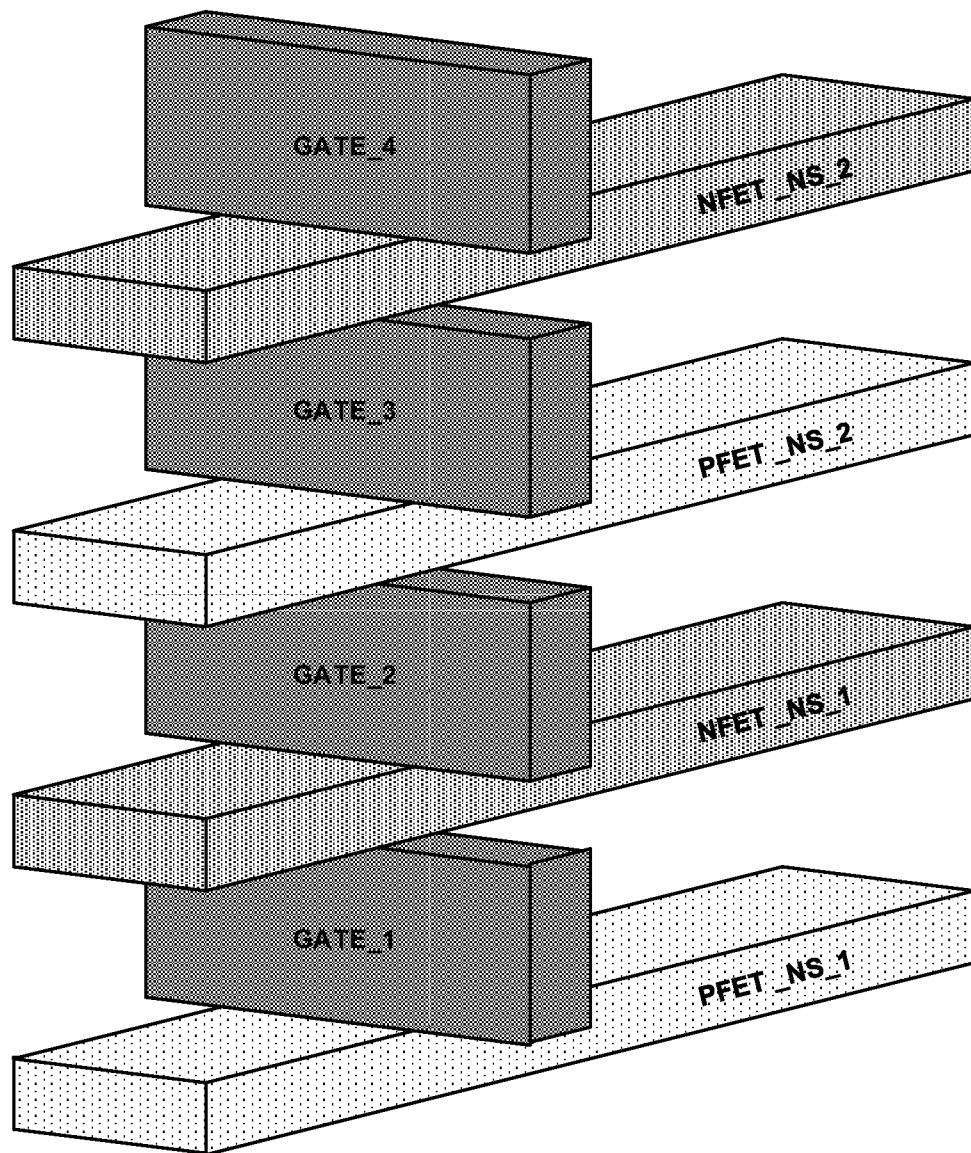

As shown in FIG. 2K, a PNPN common-gate related transistor architecture 204K may provide for multiple transistors (e.g., 2 NFET devices and 2 PFET devices) arranged in a multi-transistor stack configuration. In some instances, the PNPN transistor architecture 204K may refer to an N-over-P-over-N-over-P stack structure. Further, as shown in FIG. 2K, a PNPN split-gate related transistor architecture 204L may have multiple transistors (e.g., 2 NFET devices and 2 PFET devices) arranged in another multi-transistor stack configuration. In some instances, the PNPN transistor architecture 204L may refer to an N-over-P-over-N-over-P stack structure.

Figure 2M:
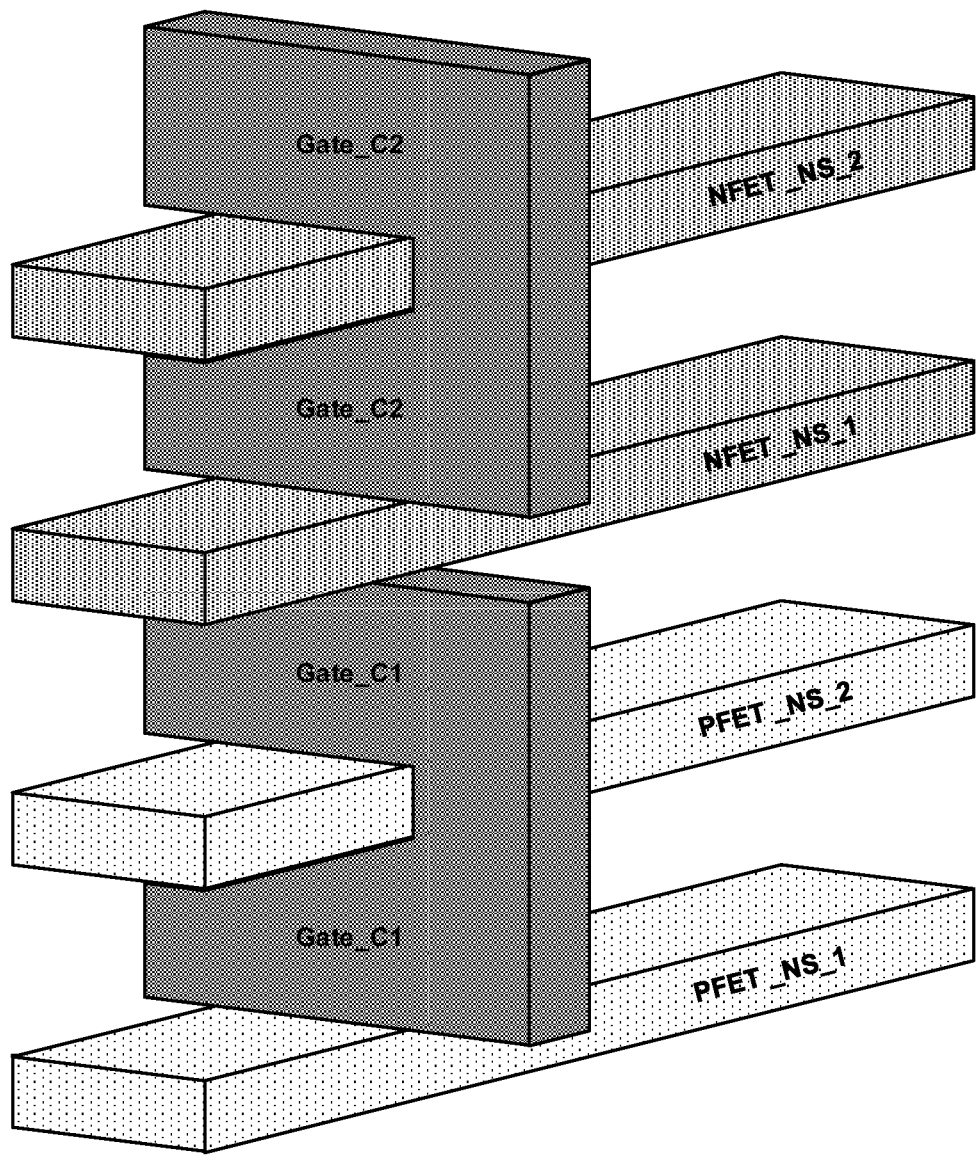
Figure 2N:
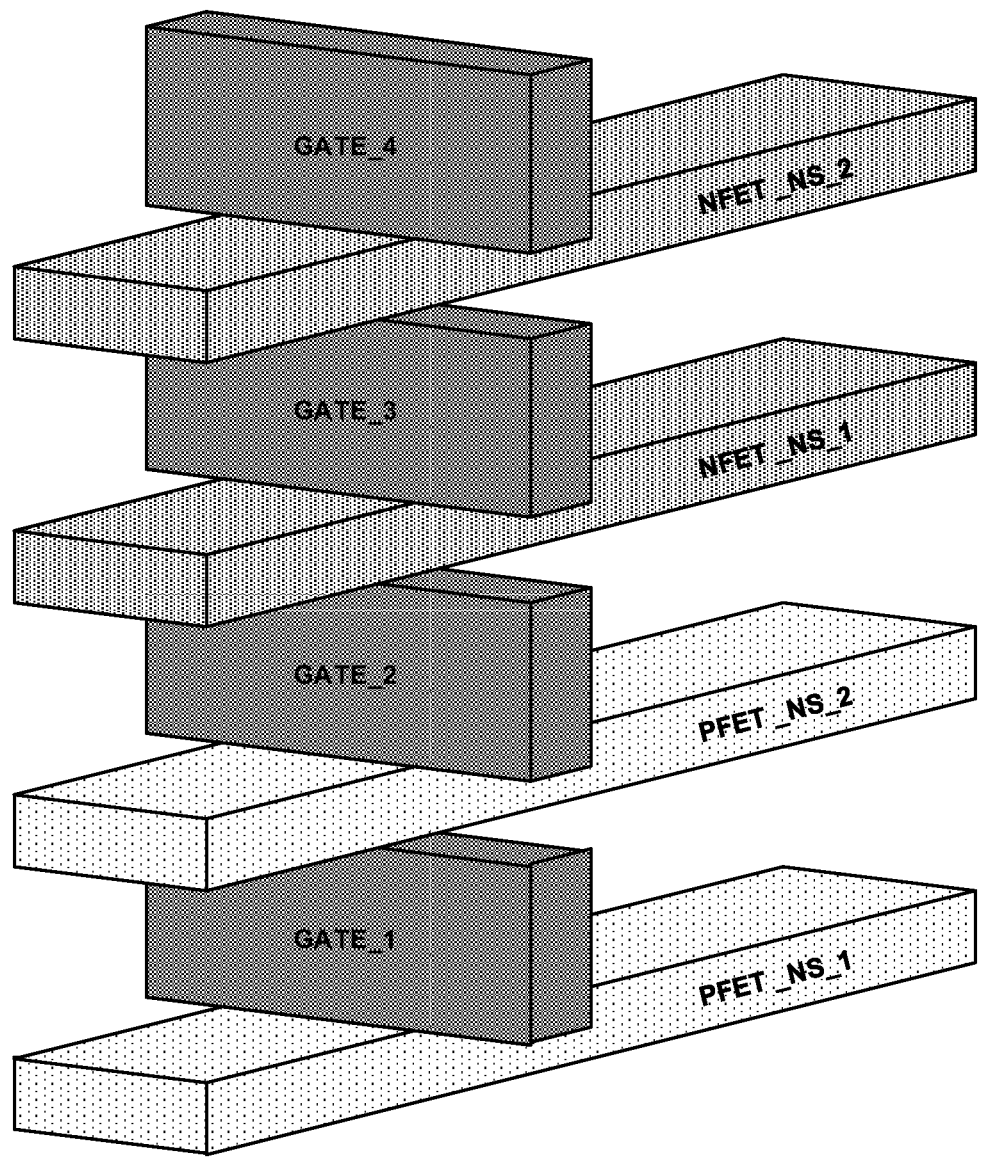

As shown in FIG. 2M, a PPNN common-gate related transistor architecture 204M may provide for multiple transistors (e.g., 2 NFET devices and 2 PFET devices) arranged in a multi-transistor stack configuration. In some instances, the PPNN transistor architecture 204M may refer to an N-over-N-over-P-over-P stack structure. Further, as shown in FIG. 2M, a PPNN split-gate related transistor architecture 204N may have multiple transistors (e.g., 2 NFET devices and 2 PFET devices) arranged in another multi-transistor stack configuration. In some instances, the PPNN transistor architecture 204N may refer to an N-over-N-over-P-over-P stack structure.

Figure 2O:
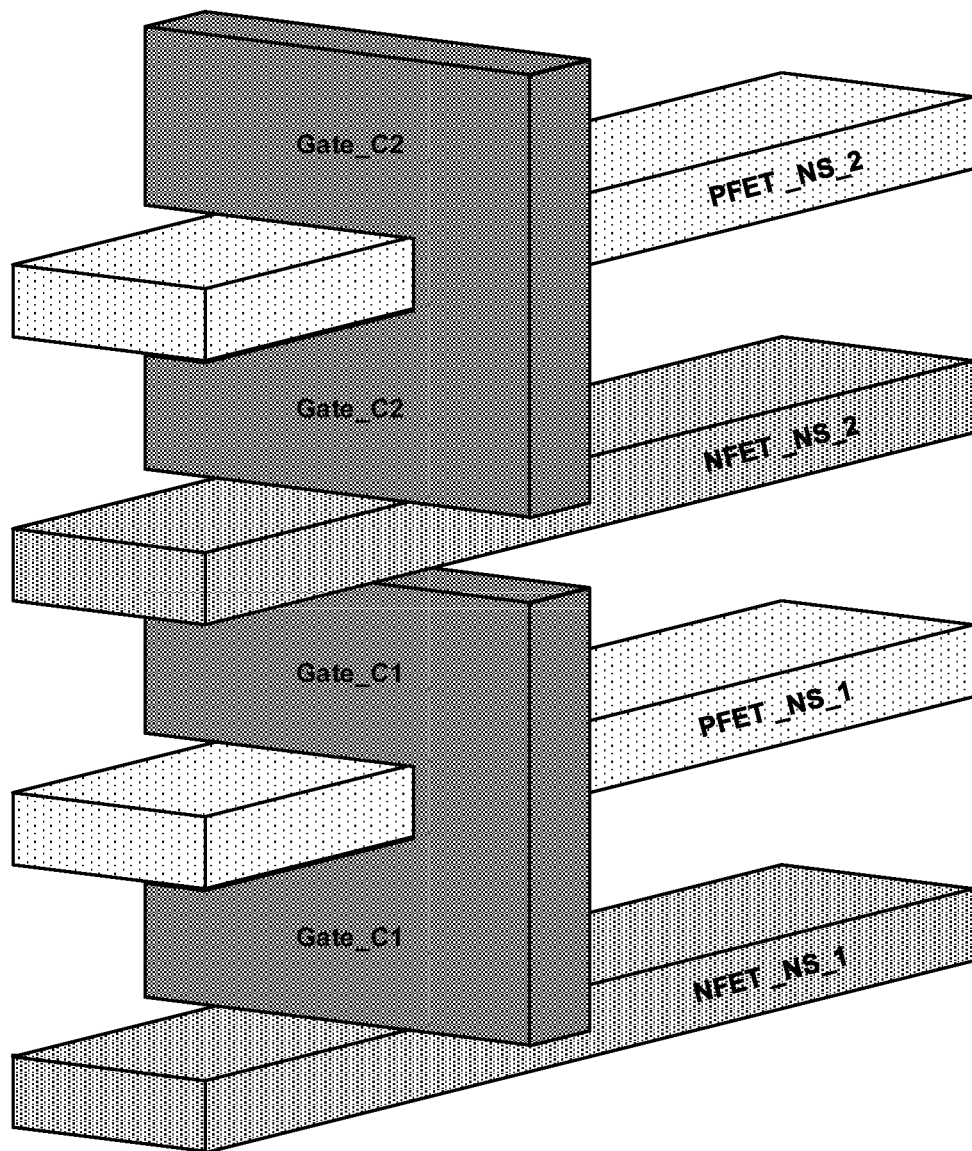
Figure 2P:
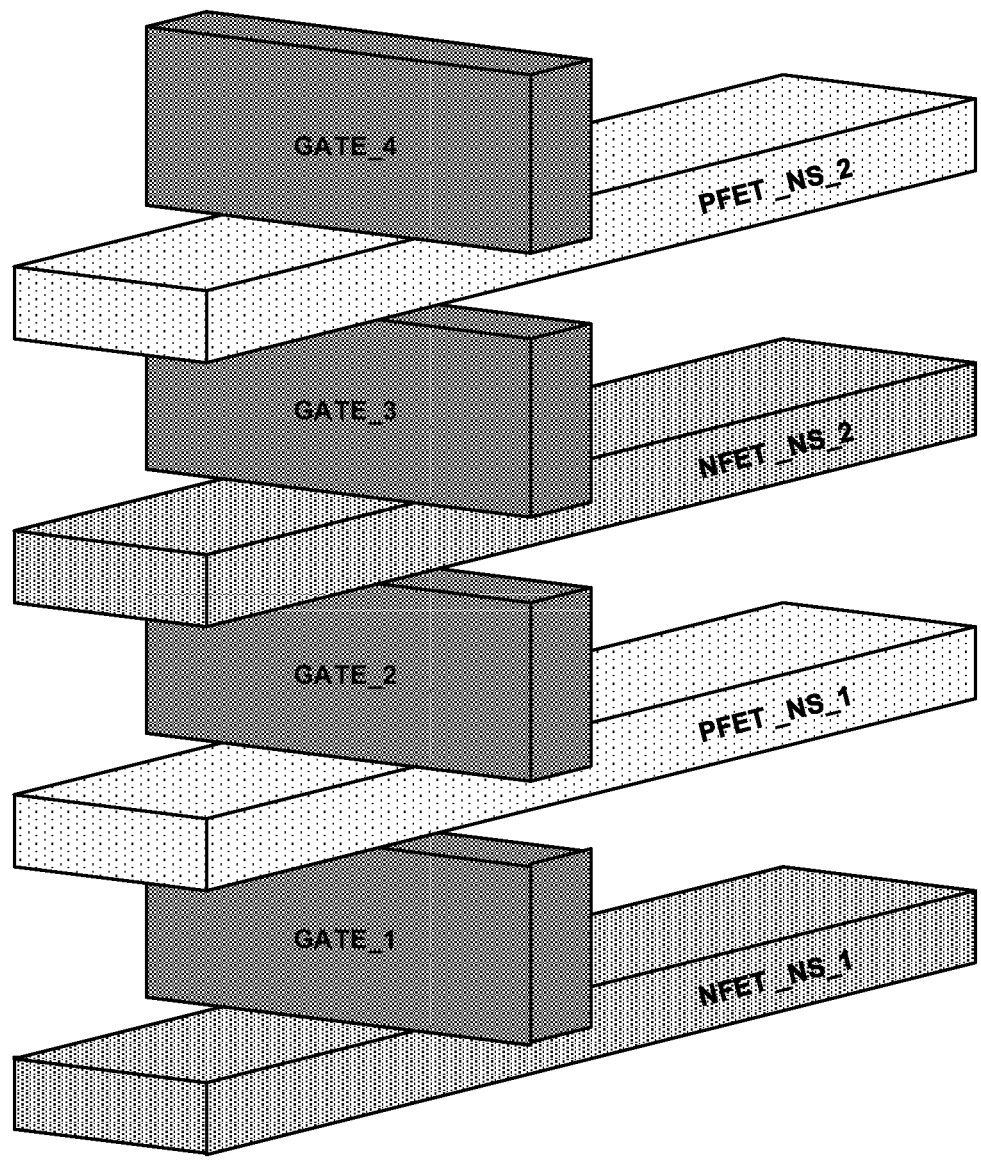

As shown in FIG. 2O, an NPNP common-gate related transistor architecture 204O may provide for multiple transistors (e.g., 2 NFET devices and 2 PFET devices) arranged in a multi-transistor stack configuration. In some instances, the NPNP transistor architecture 204O may refer to a P-over-N-over-P-over-N stack structure. Further, as shown in FIG. 2P, a NPNP split-gate related transistor architecture 204M may have multiple transistors (e.g., 2 NFET devices and 2 PFET devices) arranged in another multi-transistor stack configuration. In some instances, the NPNP transistor architecture 204P may refer to a P-over-N-over-P-over-N stack structure.

The various implementations described herein refer to fabrication schemes and techniques that provide for various multi-transistor stack architectures in various physical layout designs for multi-transistor stack applications. In various instances, FIGS. 1A-1H provide for a two-transistor (e.g., 2T) stack architecture in the same, single vertical stack, and further, FIGS. 2A-2H provide for a four-transistor (e.g., 4T) stack architecture in the same, single vertical stack. Also, the various implementations described herein refer to a method for manufacturing, and/or causing to be manufactured, multiple devices packaged within a single semiconductor die. The multiple devices may have a number (F) of first devices (e.g., Ftransistors) that are arranged in a first multi-transistor stack with a first P-N configuration, and also, the multiple devices may include a number (S) of second devices (e.g., Stransistors) arranged in a second multi-transistor stack with a second P-N configuration that is different than the first P-N configuration.

In some implementations, each of the first multi-transistor stack and the second multi-transistor stack may be arranged in the same, single vertical stack with the common-gate architecture. Also, in other implementations, each of the first multi-transistor stack and the second multi-transistor stack may be arranged in the same, single vertical stack with the split-gate architecture. However, in various implementations, any type of different combinations may be used that seek to combine common-gate multi-transistor structures with split-gate multi-transistor structures. In some instances, a first multi-transistor stack may have a first two-transistor stack, and the second multi-transistor stack may have a second two-transistor stack. The first P-N configuration may refer to at least one of a P-over-N(PN) configuration, an N-over-P (NP) configuration, a P-over-P (PP) configuration, and an N-over-N(NN) configuration. The second P-N configuration may refer to at least one of a P-over-N(PN) configuration, an N-over-P (NP) configuration, a P-over-P (PP) configuration, and an N-over-N(NN) configuration. Also, in some instances, the first devices refer to first field-effect transistor (FET) devices including at least one of an N-type FET (NFET) and a P-type FET (PFET). Also, in some instances, the second devices refer second field-effect transistors (FET) including at least one of an N-type FET (NFET) and a P-type FET (PFET).

Figure 3:
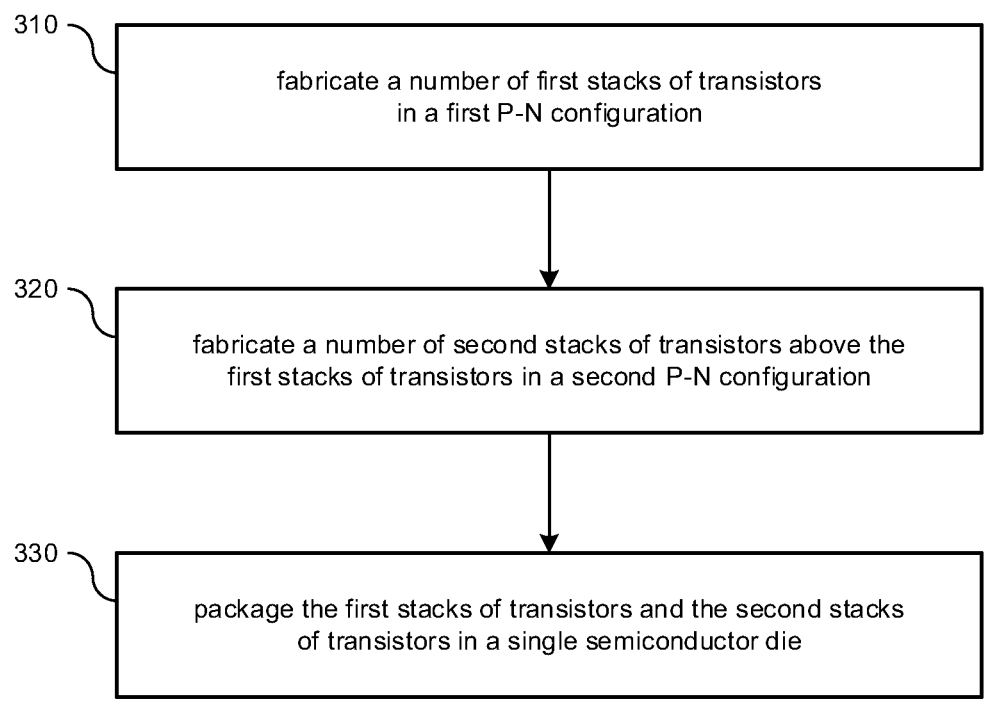
FIG. 3 illustrates a diagram of a method for manufacturing multi-transistor stack architecture in accordance with various implementations described herein.

FIG. 3 illustrates a diagram of a method 300 for manufacturing multi-transistor stack architecture in accordance with various implementations described herein. In some implementations, method 300 may be used to manufacture, or cause to be manufactured, multi-transistor (e.g., 2T and/or 4T) stack architecture. In some implementations, method 300 may be used to manufacture, or cause to be manufactured, any number (N) of multi-transistor (e.g., Ntransistors) stack architecture.

It should be understood that even though the method 300 indicates a particular order of operation execution, in some cases, various particular portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1A-2H. Also, if implemented in software, method 300 may be implemented as a program and/or software instruction process configured for providing multi-transistor stack architecture schemes and techniques, as described herein. Further, if implemented in software, various instructions associated with implementing method 300 may be stored in memory and/or a database. For instance, various types of computing devices having a processor and memory may be configured to perform method 300.

In various implementations, method 300 may refer to a method of designing, providing, constructing, fabricating and/or manufacturing, or causing to be manufactured, multiple devices packaged within a single semiconductor die as an integrated device that may involve use of various components and materials described herein. Also, the multiple devices may be packaged and/or integrated with various computing circuitry and related components on a single chip, and the multiple devices may be implemented in embedded systems for electronic, mobile and/or Internet-of-things (IoT) applications.

At block 310, method 300 may fabricate a number of first stacks of transistors in a first P-N configuration. At block 320, method 300 may fabricate a number of second stacks of transistors above the first stacks of transistors in a second P-N configuration. Further, at block 330, method 300 may package the first stacks of transistors and the second stacks of transistors in a single semiconductor die. In various instances, each of the first stacks of transistors may include a first two-transistor stack, and also, each of the second stacks of transistors may include a second two-transistor stack. Also, the first stacks of transistors and the second stacks of transistors may each be arranged in a single vertical stack with a common-gate architecture and/or a split-gate architecture.

In some implementations, the first P-N configuration may refer to at least one of a P-over-N configuration, an N-over-P configuration, a P-over-P configuration and an N-over-N configuration. Further, in some implementations, the second P-N configuration may refer to at least one of a P-over-N configuration, an N-over-P configuration, a P-over-P configuration and an N-over-N configuration. In various implementations, method 300 may be used to manufacture, or cause to be manufactured, any number (N) of multi-transistor (e.g., Ntransistors) stack architecture.

In various implementations, method 300 may be used to manufacture, or cause to be manufactured, multiple devices packaged within a single monolithic semiconductor die. The multiple devices may have first devices that are arranged in a first multi-transistor stack with a first P-N configuration. Also, the multiple devices may have second devices that are arranged in a second multi-transistor stack with a second P-N configuration that is different than the first P-N configuration.

In various implementations, each of the first stacks of transistors may include multiple first field-effect transistor (FET) devices including at least one of an N-type FET (NFET) and a P-type FET (PFET). Also, in various implementations, each of the second stacks of transistors may include second field-effect transistors (FET) including at least one of an N-type FET (NFET) and a P-type FET (PFET).

Figure 4:
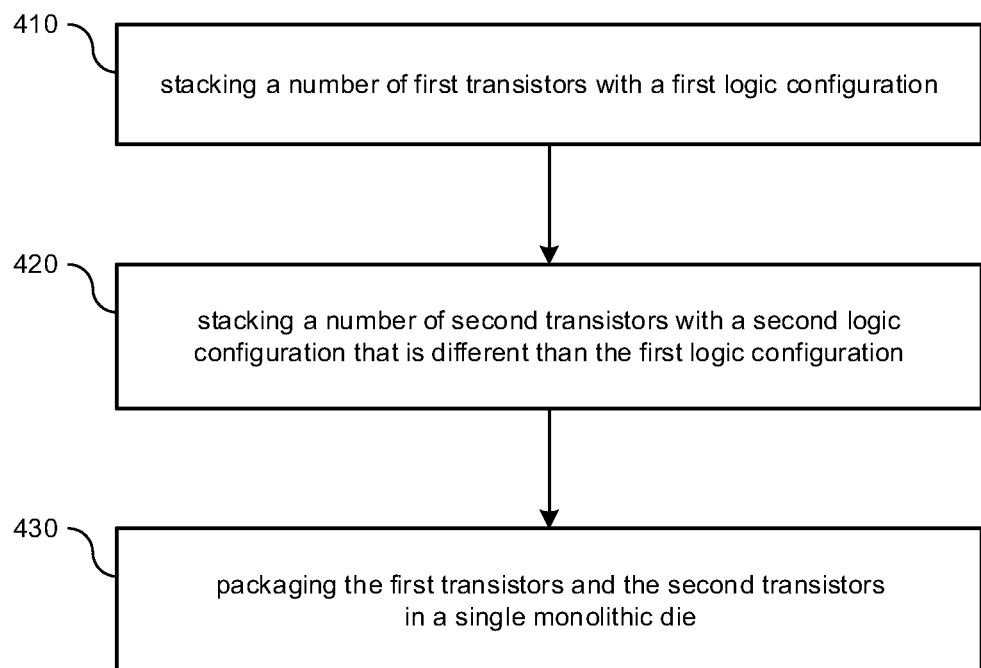
FIG. 4 illustrates a diagram of a method for manufacturing multi-transistor stack architecture in accordance with various implementations described herein.

FIG. 4 illustrates a diagram of a method 400 for manufacturing multi-transistor stack architecture in accordance with various implementations described herein. In some implementations, method 400 may be used to manufacture, or cause to be manufactured, multi-transistor (e.g., 2T and/or 4T) stack architecture. In some implementations, method 400 may be used to manufacture, or cause to be manufactured, any number (N) of multi-transistor (e.g., Ntransistors) stack architecture.

It should be understood that even though the method 400 indicates a particular order of operation execution, in some cases, various particular portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1A-2H. Also, if implemented in software, method 400 may be implemented as a program and/or software instruction process configured for providing multi-transistor stack architecture schemes and techniques, as described herein. Further, if implemented in software, various instructions associated with implementing method 400 may be stored in memory and/or a database. For instance, various types of computing devices having a processor and memory may be configured to perform method 400.

In various implementations, method 400 may refer to a method of designing, providing, constructing, fabricating and/or manufacturing, or causing to be manufactured, multiple devices packaged within a single semiconductor die as an integrated device that may involve use of various components and materials described herein. Also, the multiple devices may be packaged and/or integrated with various computing circuitry and related components on a single chip, and the multiple devices may be implemented in embedded systems for electronic, mobile and/or Internet-of-things (IoT) applications.

In some implementations, at block 410, method 400 may stack a number of first transistors with a first logic configuration, and at block 420, method 400 may stack a number of second transistors with a second logic configuration that is different than the first logic configuration. Also, at block 430, method 400 may package the first transistors and the second transistors in a single monolithic semiconductor die. In some instances, each of the first transistors and the second transistors may be arranged in a single vertical stack with a gate architecture, such as, e.g., a common-gate architecture and/or with a split-gate architecture.

In various implementations, the first logic configuration may refer to at least one of a P-over-N(PN) two-transistor stack configuration, an N-over-P (NP) two-transistor stack configuration, a P-over-P (PP) two-transistor stack configuration, and an N-over-N(NN) two-transistor stack configuration. Further, in various implementations, the second logic configuration may refer to at least one of a P-over-N(PN) two-transistor stack configuration, an N-over-P (NP) two-transistor stack configuration, a P-over-P (PP) two-transistor stack configuration and an N-over-N(NN) two-transistor stack configuration that may be different than the first logic configuration. In various implementations, method 400 may be used to manufacture, or cause to be manufactured, any number (N) of multi-transistor (e.g., Ntransistors) stack architecture.

In various implementations, the first logic configuration may refer to at least one of a P-over-N-over-N-over-P (PNNP) four-transistor stack configuration, an N-over-P-over-P-over-N(NPPN) four-transistor stack configuration, an N-over-N-over-N-over-N (NNNN) four-transistor stack configuration, a P-over-P-over-P-over-P (PPPP) four-transistor stack configuration, a P-over-P-over-N-over-N (PPNN) four-transistor stack configuration, and an N-over-N-over-P-over-P (NNPP) four-transistor stack configuration. Further, in various implementations, the second logic configuration may refer to at least one of a P-over-N-over-N-over-P (PNNP) four-transistor stack configuration, an N-over-P-over-P-over-N(NPPN) four-transistor stack configuration, an N-over-N-over-N-over-N(NNNN) four-transistor stack configuration, a P-over-P-over-P-over-P (PPPP) four-transistor stack configuration, a P-over-P-over-N-over-N(PPNN) four-transistor stack configuration, and an N-over-N-over-P-over-P (NNPP) four-transistor stack configuration that may be different than the first logic configuration. Various other stack configurations may be used, such as, e.g., PNPN and NPNP stack configurations, along with the other multi-transistor stack configurations, such as, e.g., as described herein above in reference to FIGS. 1A-1H and 2A-2P.

Described herein are various implementations of a method for manufacturing, or causing to be manufactured, multiple devices packaged within a single semiconductor die. The multiple devices may have first devices that are arranged in a first multi-transistor stack with a first P-N configuration. The multiple devices may have second devices that are arranged in a second multi-transistor stack with a second P-N configuration that is different than the first P-N configuration.

Described herein are various implementations of a method of fabricating first stacks of transistors and second stacks of transistors. The method may fabricate the first stacks of transistors in a first P-N configuration, and the method may fabricate the second stacks of transistors above the first stacks of transistors in a second P-N configuration. Also, the method may package the first stacks of transistors and the second stacks of transistors in a single semiconductor die.

Described herein are various implementations of a method for stacking first transistors and second transistors. The method may stack first transistors with a first logic configuration, and also, the method may stack second transistors with a second logic configuration that is different than the first logic configuration. Moreover, the method may package the first transistors and the second transistors in a single monolithic die.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A method comprising:
   manufacturing, or causing to be manufactured, multiple devices packaged within a single semiconductor die, wherein:
   the multiple devices include first devices arranged in a first multi-transistor stack with a first P-N configuration, and
   the multiple devices include second devices arranged in a second multi-transistor stack with a second P-N configuration that is different than the first P-N configuration.

2. The method of claim 1, wherein each of the first multi-transistor stack and the second multi-transistor stack are arranged in a single vertical stack with a common-gate architecture.

3. The method of claim 1, wherein each of the first multi-transistor stack and the second multi-transistor stack are arranged in a single vertical stack with a split-gate architecture.

4. The method of claim 1, wherein:
   the first multi-transistor stack includes a first two-transistor stack, and
   the second multi-transistor stack includes a second two-transistor stack.

5. The method of claim 1, wherein:
   the first P-N configuration refers to an N-over-P configuration.

6. The method of claim 1, wherein:
   the second P-N configuration refers to P-over-N configuration.

7. The method of claim 1, wherein the first devices include first field-effect transistor (FET) devices including at least one of an N-type FET (NFET) and a P-type FET (PFET).

8. The method of claim 1, wherein the second devices include second field-effect transistors (FET) including at least one of an N-type FET (NFET) and a P-type FET (PFET).

9. A method comprising:
   fabricating first stacks of transistors in a first P-N configuration;
   fabricating second stacks of transistors above the first stacks of transistors in a second P-N configuration; and
   packaging the first stacks of transistors and the second stacks of transistors in a single semiconductor die.

10. The method of claim 9, wherein the first stacks of transistors along with the second stacks of transistors are arranged in a single vertical stack with a common-gate architecture.

11. The method of claim 9, wherein the first stacks of transistors along with the second stacks of transistors are arranged in a single vertical stack with a split-gate architecture.

12. The method of claim 9, wherein:
   each of the first stacks of transistors includes a first two-transistor stack, and
   each of the second stacks of transistors includes a second two-transistor stack.

13. The method of claim 9, wherein:
   the first P-N configuration refers to an N-over-P configuration.

14. The method of claim 9, wherein:
   the second P-N configuration refers to a P-over-N configuration.

15. The method of claim 9, wherein each of the first stacks of transistors includes multiple first field-effect transistor (FET) devices including at least one of an N-type FET (NFET) and a P-type FET (PFET).

16. The method of claim 9, wherein each of the second stacks of transistors includes second field-effect transistors (FET) including at least one of an N-type FET (NFET) and a P-type FET (PFET).

17. A method comprising:
    stacking first transistors with a first logic configuration;
    stacking second transistors with a second logic configuration that is different than the first logic configuration; and
    packaging the first transistors and the second transistors in a single monolithic die.

18. The method of claim 17, wherein:
    the first transistors and the second transistors are arranged in a single vertical stack with a split-gate architecture.

19. The method of claim 17, wherein:
    the first logic configuration refers to an N-over-P two-transistor stack configuration, and
    the second logic configuration refers to a P-over-N two-transistor stack configuration.

20. The method of claim 17, wherein:
    the first logic configuration refers to a P-over-N-over-N-over-P four-transistor stack configuration, and
    the second logic configuration refers to a P-over-N-over-N-over-P four-transistor stack configuration.

* * * * *